United States Patent
Athavale et al.

(10) Patent No.: US 11,380,558 B2
(45) Date of Patent: *Jul. 5, 2022

(54) OPTICAL SENSOR PACKAGING SYSTEM

(71) Applicant: Maxim Integrated Products, Inc., San Jose, CA (US)

(72) Inventors: Saurabh Nilkanth Athavale, Milpitas, CA (US); Yi-Sheng Anthony Sun, San Jose, CA (US); Zhiyong Wang, Saratoga, CA (US); Tie Wang, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 16/908,596

(22) Filed: Jun. 22, 2020

(65) Prior Publication Data

US 2020/0335359 A1 Oct. 22, 2020

Related U.S. Application Data

(63) Continuation of application No. 16/281,579, filed on Feb. 21, 2019, now Pat. No. 10,727,086.

(Continued)

(51) Int. Cl.
*H01L 23/48* (2006.01)
*H01L 23/52* (2006.01)
*H01L 21/56* (2006.01)
*H01L 25/16* (2006.01)
*H01L 31/18* (2006.01)

(Continued)

(52) U.S. Cl.
CPC ............ *H01L 21/56* (2013.01); *H01L 24/08* (2013.01); *H01L 25/167* (2013.01); *H01L 31/02002* (2013.01); *H01L 31/0203* (2013.01); *H01L 31/18* (2013.01)

(58) Field of Classification Search
CPC .......... H01L 24/13; H01L 2924/14; H01L 23/49833; H01L 21/76885; H01L 21/50; H01L 21/76877; H01L 24/08; H01L 24/80; H01L 25/043; H01L 25/0756; H01L 2224/32227; H01L 23/16; H01L 23/4334; H01L 24/82; H01L 25/072; H01L 31/0203; H01L 23/3114; H01L 31/0232;

(Continued)

(56) References Cited

U.S. PATENT DOCUMENTS

| 9,741,875 | B2 | 8/2017 | Shen et al. |
| 10,727,086 | B2 * | 7/2020 | Athavale ................. H01L 21/56 |
| 2009/0309179 | A1 | 12/2009 | Hsu et al. |

* cited by examiner

*Primary Examiner* — Theresa T Doan
(74) *Attorney, Agent, or Firm* — Robert Crownover

(57) ABSTRACT

An optical sensor packaging system and method can include: providing a substrate, the substrate including a redistribution pad; mounting an optical sensor to the substrate, the optical sensor including a photo sensitive material formed on a photo sensitive area of an active optical side of the optical sensor; wire-bonding the optical sensor to the substrate with a first bond wire connected from the active optical side to the redistribution pad; and encapsulating the optical sensor, the first bond wire, and the photo sensitive material with an over-mold, the over-mold formed with a top surface co-planar to a surface of the photo sensitive material, the over-mold forming a vertically extended border around the photo sensitive material and around the photo sensitive area, and the over-mold formed above the first bond wire.

22 Claims, 19 Drawing Sheets

Related U.S. Application Data

(60) Provisional application No. 62/647,660, filed on Mar. 24, 2018.

(51) Int. Cl.
 *H01L 31/0203* (2014.01)
 *H01L 31/02* (2006.01)
 *H01L 23/00* (2006.01)

(58) Field of Classification Search
 CPC ............... H01L 31/02325; H01L 31/18; H01L 25/0655; H01L 25/50
 USPC ................................................. 257/737, 680
 See application file for complete search history.

OPTICAL SENSOR PACKAGING SYSTEM

CROSS-REFERENCE TO RELATED APPLICATION(S)

This is a continuation of U.S. patent application Ser. No. 16/281,579 filed Feb. 21, 2019, which claims the benefit of priority to U.S. Provisional Patent Application No. 62/647,660 filed Mar. 24, 2018 and claims priority benefit to all common subject matter. The content of these applications, in their entirety, are incorporated herein by reference.

TECHNICAL FIELD

This disclosure relates to integrated circuit packaging, more particularly to optical sensor packaging formation with photo sensitive material, for example.

BACKGROUND

The rapidly growing market for portable electronics devices, e.g. cellular phones, laptop computers, and wearable devices is an integral facet of modern life. The multitude of portable devices represents one of the largest potential market opportunities for next generation biological sensor packaging. These devices have unique attributes that have significant impacts on manufacturing integration, in that they must be generally small, lightweight, and rich in functionality and they must be produced in high volumes at relatively low cost.

As an extension of the semiconductor industry, the biological sensor industry, including heart rate monitors and peripheral oxygen sensors, for example, has witnessed ever-increasing commercial competitive pressures, along with growing consumer expectations and the diminishing opportunities for meaningful product differentiation in the marketplace.

Packaging size and layout are at the very core of these next generation electronics insertion strategies outlined in road maps for development of next generation products. Competitive next generation products should increase signal to noise ratio, decrease costs, and operate with increased sensor performance. Importantly, for some industry segments including wearable rings, achieving smaller form factors and reducing power requirements is critical.

There have been many approaches to addressing the advanced packaging requirements of microprocessors and optical sensors with successive generations of semiconductors. Many industry road maps have identified significant gaps between the current sensor capability and the available supporting electronic packaging technologies. The limitations and issues with current technologies include large die size, higher costs, and compromised optical properties.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints, lower costs, and improved optical properties. Solutions to these problems have been long sought but prior developments have not taught or suggested any solutions and, thus, solutions to these problems have long eluded those skilled in the art.

BRIEF DESCRIPTION OF THE DRAWINGS

The optical sensor packaging system is illustrated in the figures of the accompanying drawings which are meant to be exemplary and not limiting, in which like reference numerals are intended to refer to like components, and in which.

DETAILED DESCRIPTION

Figure 1:
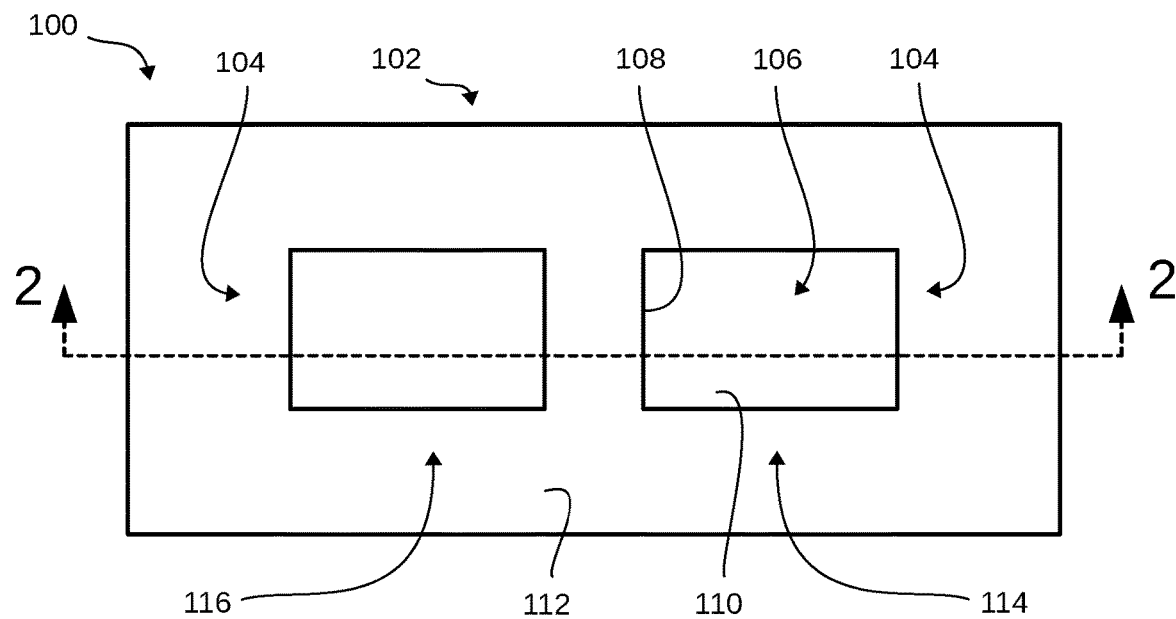
FIG. 1 is a top view of the packaging system in a first embodiment.

In the following description, reference is made to the accompanying drawings that form a part hereof, and in which are shown by way of illustration, embodiments in which the packaging system may be practiced. It is to be understood that other embodiments may be utilized and structural changes may be made without departing from the scope of the packaging system.

When features, aspects, or embodiments of the packaging system are described in terms of steps of a process, an operation, a control flow, or a flow chart, it is to be understood that the steps can be combined, performed in a different order, deleted, or include additional steps without departing from the packaging system as described herein.

The packaging system is described in sufficient detail to enable those skilled in the art to make and use the packaging system and provide numerous specific details to give a thorough understanding of the packaging system; however, it will be apparent that the packaging system may be practiced without these specific details.

In order to avoid obscuring the packaging system, some well-known system configurations and descriptions are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the packaging system can be operated in any orientation.

As used herein, the term system is defined as a device or method depending on the context in which it is used. For expository purposes, the term "horizontal" as used herein is defined as a plane parallel to the top plane or top surface of the over-mold, regardless of its orientation. The term "vertical" refers to a direction perpendicular to the horizontal as just defined. Terms, such as "above", "below", "bottom", "top", "side", "higher", "lower", "upper", "over", and "under", are defined with respect to the horizontal plane.

As used herein, the term "coupled" means any physical contact including contact through intervening elements. As used herein, the term "co-planar" means the plane of two or more flat surfaces is the same plane.

The packaging system is disclosed and illustrated in reliance on an optical sensor for clarity only. It is to be understood by those of ordinary skill in the art that an optical sensor is not to be considered a requirement of the packaging system unless explicitly claimed. It is contemplated that the packaging system can be alternatively implemented with a pressure sensor, a fluidic sensor, a chemical sensor, a finger print sensor, an environmental sensor, or a combination thereof.

Referring now to FIG. 1, therein is shown a top view of the packaging system 100 in a first embodiment. The packaging system 100 is shown having an over-mold 102 partially encapsulating optical sensors 104.

The optical sensors 104 are exposed from within sensing windows 106 of the over-mold 102. The sensing windows 106 can be bordered by vertically extended border 108 and can expose the optical sensors 104 between the vertically extended borders 108 from an active optical side 110 of the optical sensor 104 to a top surface 112 of the over-mold 102. The optical sensors 104 are depicted as a left optical sensor 114 and a right optical sensor 116. Each of the optical sensors 104 are individually exposed from the sensing windows 106.

Figure 2:
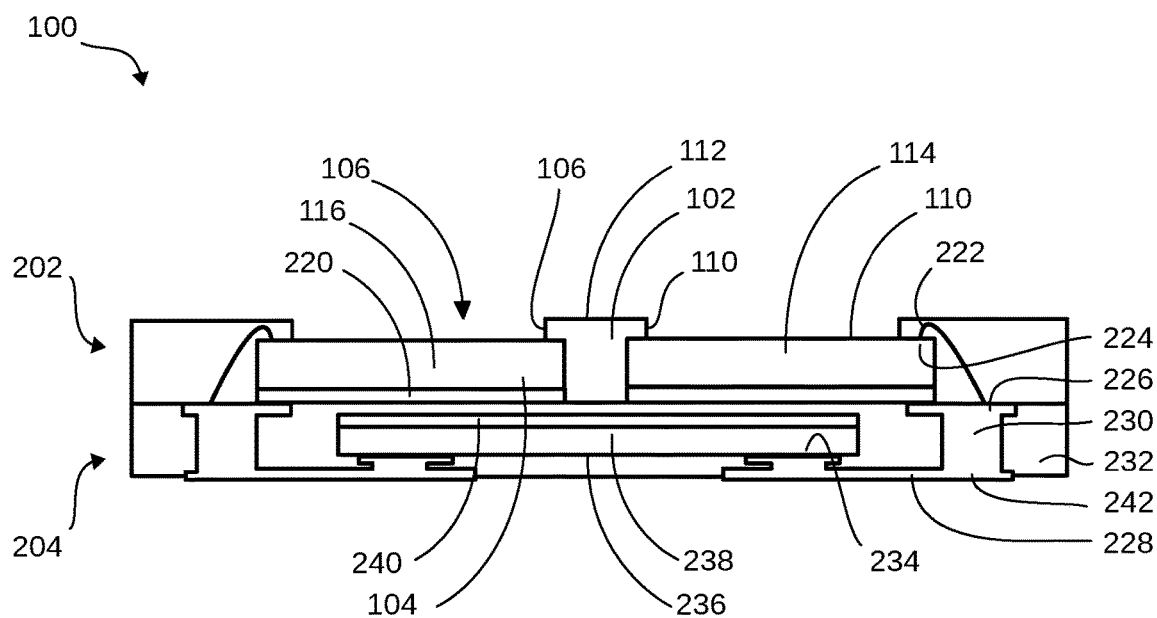
FIG. 2 is a cross-sectional view of the packaging system of FIG. 1 along the line 2-2.

Referring now to FIG. 2, therein is shown a cross-sectional view of the packaging system 100 of FIG. 1 along the line 2-2. The packaging system 100 is depicted having an optical sensor module 202 formed above an embedded substrate 204. The optical sensor module 202 can include the over-mold 102 partially encapsulating the optical sensors 104.

The optical sensors 104 are exposed from within the sensing windows 106 of the over-mold 102. The sensing windows 106 can expose the optical sensors 104 between the vertically extended borders 108. The vertically extended border 108 can extend from the active optical side 110 of the optical sensor 104 to the top surface 112 of the over-mold 102.

The over-mold 102 can be an epoxy encapsulation including a blend of solid epoxy resins, hardeners, flame retardants, fillers, and other additives. The over-mold 102 can be molded to form the vertically extended border 108 surrounding the sensing window 106 for exposing the active optical side 110 therethrough.

The optical sensors 104 can be photoconductive sensors detecting a change of incident light with a change of resistance, a photovoltaic cell detecting incident light with a change in output voltage, a photodiode detecting an amount of incident light with a change in output current, or a combination thereof. The right optical sensor 116 and the left optical sensor 114 are contemplated to be sensors; however, it is alternatively contemplated, for example, that the right optical sensor 116, the left optical sensor 114, or a combination thereof could be replaced with a light source such as light emitting diodes.

The active optical side 110 can be one side of the optical sensor 104 having active components such as transistors and diodes formed thereon. The active optical side 110 is depicted facing up in the same direction as the top surface 112 of the over-mold 102. It is alternatively contemplated that the optical sensor 104 could include the active optical side 110 facing down toward the embedded substrate 204, for example when the optical sensor 104 is configured to sense longer wavelengths propagating through the body material of the optical sensor 104.

The top surface 112 can be a planar surface parallel to the active optical side 110 of the optical sensor 104. The vertically extended borders 108 around the sensing window 106 are illustratively depicted as extending vertically up away from the active optical side 110.

It is contemplated that alternative embodiments could include the vertically extended border 108 extending vertically but at an angle toward the center of the optical sensor 104 or away from the center of the optical sensor 104. The sensing windows 106 are depicted as individual windows over both the left optical sensor 114 and the right optical sensor 116.

The vertically extended border 108 can be formed on top of the optical sensor 104 in direct contact with the active optical side 110. The optical sensors 104 can be affixed to the embedded substrate 204 with a die attach material 220.

The die attach material 220 can be a die attach adhesive such an epoxy, a polymer adhesive with thermally conductive fillers, or a eutectic die attach material. Both the left optical sensor 114 and the right optical sensor 116 are depicted as affixed to the embedded substrate 204 with the die attach material 220.

The active optical side 110 can be electrically coupled to the embedded substrate 204 with a bond wire 222 extended from a sensor pad 224 on the active optical side 110 of the optical sensor 104 to a redistribution pad 226 exposed from the embedded substrate 204. Illustratively, both the right optical sensor 116 and the left optical sensor 114 include a bond wire connection from the active optical side 110 of the left optical sensor 114 and the right optical sensor 116 to their respective redistribution pads 226.

It is alternatively contemplated that the bond wire 222 could be replaced with a ball bond between the sensor pad 224 and the redistribution pad 226 when the optical sensor 104 has the active optical side 110 facing down toward the embedded substrate 204. The over-mold 102 is shown encapsulating the bond wires 222, the die attach material 220, and the optical sensors 104 above the embedded substrate 204.

The top surface 112 of the over-mold 102 is shown above the bond wires 222 meaning that the vertically extended border 108 extends vertically beyond the top of the bond wire 222 to the top surface 112 in order to form the sensing window 106 and the over-mold 102 fully encapsulating the bond wire 222. The over-mold 102 is depicted between the left optical sensor 114 and the right optical sensor 116 isolating the left optical sensor 114 from the right optical sensor 116.

The redistribution pad 226 can be electrically coupled to a redistribution line 228 with a conductive pillar 230 therebetween. The conductive pillar 230 can extend through a substrate encapsulation 232 of the embedded substrate 204 from the redistribution pad 226 to the redistribution line 228.

The substrate encapsulation 232 can be an epoxy encapsulation similar to that of the over-mold 102 described above. As will be appreciated, the conductive pillar 230 can be formed along a vertical axis for connecting conductive components at different points along the vertical axis. The redistribution line 228 can be formed along a horizontal axis for connecting conductive components at different points along the horizontal axis.

The redistribution line 228 can fan out a dense input-output array 234 from an embedded chip active side 236 of an embedded chip 238. The embedded chip 238 can be an application specific integrated circuit for providing an analog front-end for the optical sensors 104.

The embedded chip 238 can include analog signal conditioning circuitry implementing sensitive analog amplifiers. As will be appreciated, providing the embedded chip 238 in the form of an ASIC can provide a configurable and flexible electronics functional block and provide hardware modularity in the embedded substrate 204.

The embedded chip active side 236 can be a side of the embedded chip 238 having active components, such as diodes and transistors, formed thereon. The embedded chip active side 236 is illustratively depicted as facing down toward the redistribution line 228 and the bottom of the embedded substrate 204.

The embedded chip 238 can be affixed to a die pad 240. The die pad 240 can provide structural stability for the embedded chip 238 during the manufacturing process of the embedded substrate 204 as well as providing a thermally conductive heat sink to draw heat out and away from the embedded chip 238. The substrate encapsulation 232 is depicted encapsulating the conductive pillar 230, top portions of the redistribution line 228, the embedded chip 238, and the die pad 240.

The redistribution line 228 is shown exposed from the substrate encapsulation 232; however, in is alternatively contemplated that the substrate encapsulation 232 could fully encapsulate the redistribution line 228 leaving only under bump material 242 exposed therefrom. The under bump material 242 can support the formation of external interconnects for connection of the packaging system 100 to external components.

Figure 3:
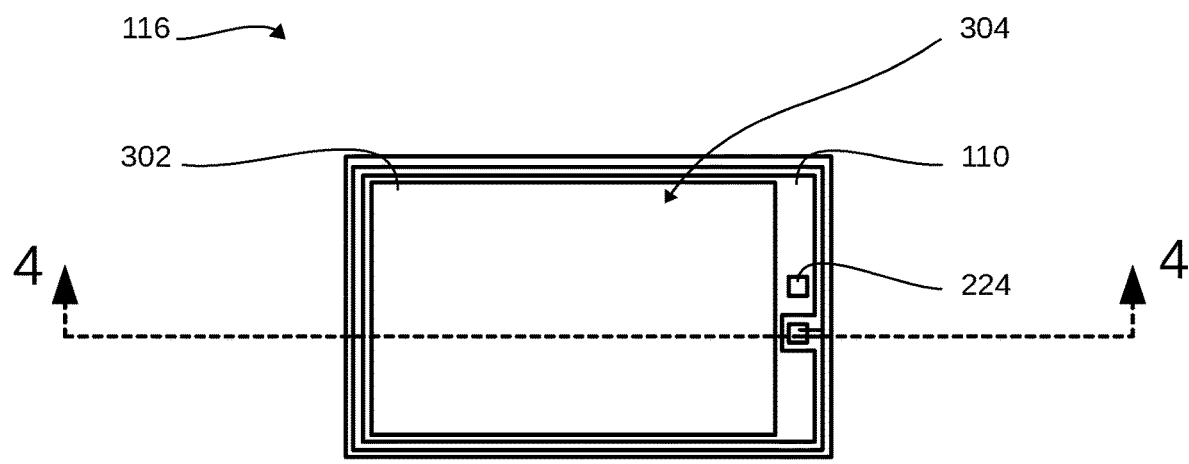
FIG. 3 is a plan view of the right optical sensor of FIG. 1 after a photo-sensitive material develop phase of manufacture.

Referring now to FIG. 3, therein is shown a plan view of the right optical sensor 116 of FIG. 1 after a photo-sensitive material develop phase of manufacture. The active optical side 110 of the right optical sensor 116 is depicted with the sensor pads 224 and having a protective layer of photo sensitive material 302 thereon.

The photo sensitive material 302, for example, can be patterned to cover a photo sensitive area 304 of the right optical sensor 116. For the purposes of this application, the photo sensitive material 302 is defined as a dual state, light sensitive material such as photo resist or a dry-film photo resist.

For example, the process of applying the photo sensitive material 302 during a photo lithography process can begin by coating a substrate with a light-sensitive organic material, the photo sensitive material 302. A patterned mask can then be applied to the surface of the photo sensitive material 302 in order to block light, so that only unmasked regions of the photo sensitive material 302 will be exposed to light. A solvent, called a developer, can then be used to remove portions of the photo sensitive material 302.

The photo sensitive material 302 can generally be of two types, a positive photo sensitive material and a negative photo sensitive material. When the photo sensitive material 302 is a positive photo sensitive material, the photo sensitive material 302 is degraded by light and the developer will dissolve away the regions that were exposed to light, leaving behind a coating where the mask was placed.

When the photo resist 302 is a negative photo sensitive material, the photo sensitive material 302 is strengthened by light, through polymerization or cross-linking, and the developer will dissolve away only the regions that were not exposed to light, leaving behind a coating in areas where the mask was not placed.

Figure 4:
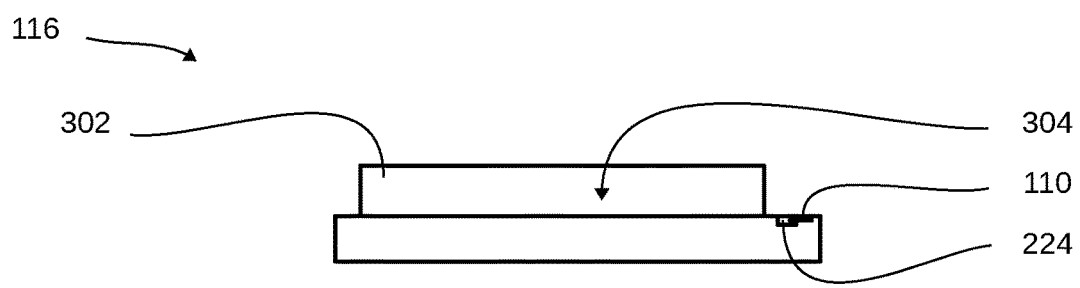
FIG. 4 is a cross-sectional view of the right optical sensor of FIG. 3 along the line 4-4.

Referring now to FIG. 4, therein is shown a cross-sectional view of the right optical sensor 116 of FIG. 3 along the line 4-4. The right optical sensor 116 is illustratively depicted having the sensor pad 224 formed in the active optical side 110.

The sensor pad 224 can be coupled to and support the bond wire 222 of FIG. 2. The photo sensitive material 302 can be seen to extend up from the active optical side 110.

The photo sensitive material 302 can have a thickness larger than the height of the bond wires 222 extending up from the sensor pad 224. As will be appreciated, the photo sensitive material 302 does not fully cover the right optical sensor 116 but instead is patterned to cover the photo sensitive area 304 of the right optical sensor 116.

Figure 5:
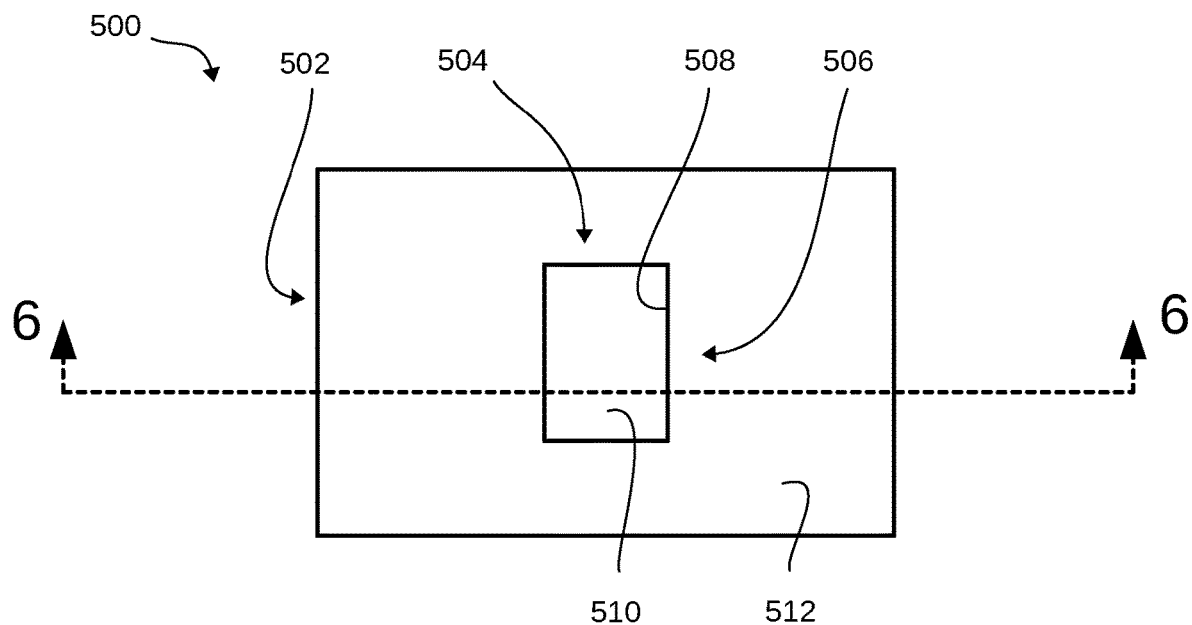
FIG. 5 is a top view of the packaging system in a second embodiment.

Referring now to FIG. 5, therein is shown a top view of the packaging system 500 in a second embodiment. The packaging system 500 is shown having an over-mold 502 partially encapsulating an optical sensor 504.

The optical sensor 504 is exposed from within a sensing window 506 of the over-mold 502. The sensing window 506 can expose the optical sensor 504 between vertically extended borders 508 from an active optical side 510 of the optical sensor 504 to a top surface 512 of the over-mold 502.

Figure 6:
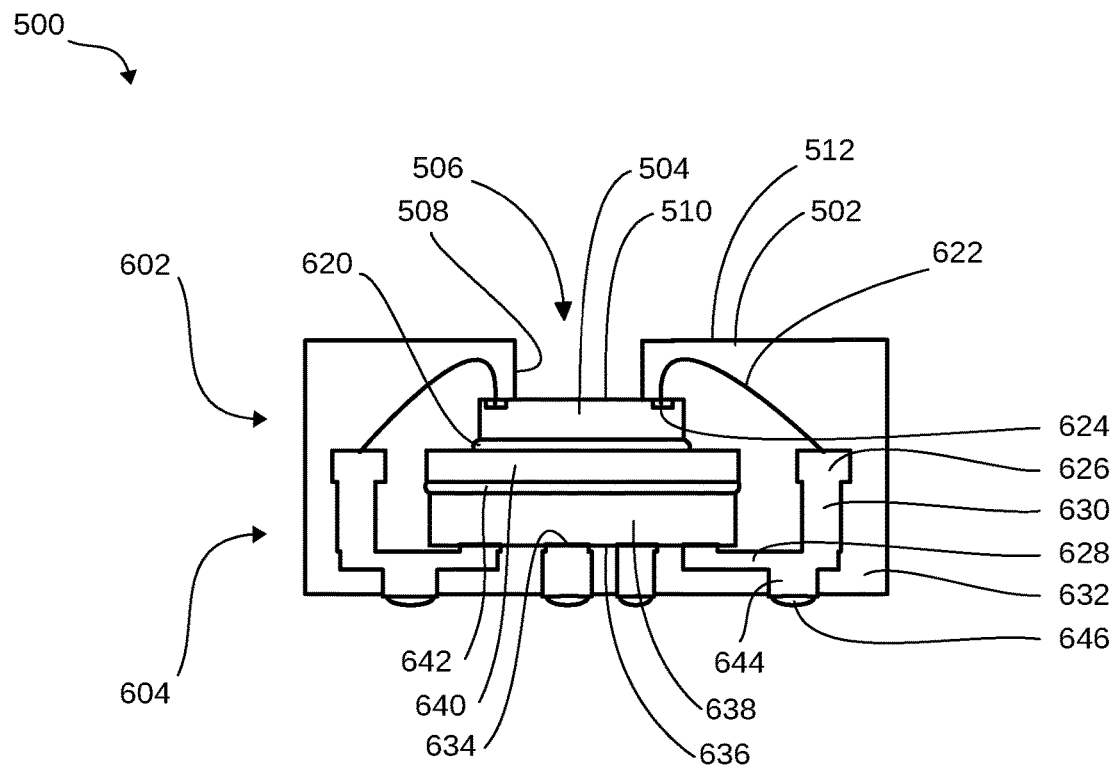
FIG. 6 is a cross-sectional view of the packaging system of FIG. 5 along the line 6-6.

Referring now to FIG. 6, therein is shown a cross-sectional view of the packaging system 500 of FIG. 5 along the line 6-6. The packaging system 500 is depicted having an optical sensor module 602 formed above an embedded substrate 604. The optical sensor module 602 can include the over-mold 502 partially encapsulating the optical sensor 504.

The optical sensor 504 is exposed from within the sensing window 506 of the over-mold 502. The sensing window 506 can expose the optical sensor 504 between the vertically extended borders 508. The vertically extended borders 508 can extend from the active optical side 510 of the optical sensor 504 to the top surface 512 of the over-mold 502.

The over-mold 502 can be an epoxy encapsulation including a blend of solid epoxy resins, hardeners, flame retardants, fillers, and other additives. The over-mold 502 can be molded to form the vertically extended border 508 surrounding the sensing window 506 for exposing the active optical side 510 therethrough.

The optical sensor 504 can be a photoconductive sensor detecting a change of incident light with a change of resistance, a photovoltaic cell detecting incident light with a change in output voltage, a photodiode detecting an amount of incident light with a change in output current, or a combination thereof. It is alternatively contemplated, for example, that multiple light sensors and light sources could be implemented without deviating from the packaging system 100 as disclosed.

The active optical side 510 can be one side of the optical sensor 504 having active components such as transistors and diodes formed thereon. The active optical side 510 is depicted facing up in the same direction as the top surface 512 of the over-mold 502. It is alternatively contemplated that the optical sensor 504 could include the active optical side 510 facing down toward the embedded substrate 604, for example when the optical sensor 504 is configured to sense longer wavelengths propagating through the body material of the optical sensor 504.

The top surface 512 can be a planar surface parallel to the active optical side 510 of the optical sensor 504. The vertically extended borders 508 around the sensing window 506 are illustratively depicted as extending vertically up away from the active optical side 510.

It is contemplated that alternative embodiments could include the vertically extended border 508 extending vertically but at an angle toward the center of the optical sensor 504 or away from the center of the optical sensor 504.

The vertically extended border 508 can be formed on top of the optical sensor 504 in direct contact with the active optical side 510. The optical sensor 504 can be affixed to the embedded substrate 604 with a die attach material 620. The die attach material 620 can be a die attach adhesive such an epoxy, a polymer adhesive with thermally conductive fillers, or a eutectic die attach material.

The active optical side 510 can be electrically coupled to the embedded substrate 604 with bond wires 622 extended from sensor pads 624 on the active optical side 510 of the optical sensor 504 to redistribution pads 626 exposed from the embedded substrate 604.

It is alternatively contemplated that the bond wire 622 could be replaced with a ball bond between the sensor pad 624 and the redistribution pad 626 when the optical sensor 504 has the active optical side 510 facing down toward the embedded substrate 604. The over-mold 502 is shown encapsulating the bond wires 622, the die attach material 620, and the optical sensor 504 above the embedded substrate 604.

The top surface 512 of the over-mold 502 is shown above the bond wires 622 meaning that the vertically extended border 508 extends vertically beyond the top of the bond wire 622 to the top surface 512 in order to form the sensing window 506 and the over-mold 502 fully encapsulating the bond wire 622. The redistribution pad 626 can be electrically coupled to a redistribution line 628 with a conductive pillar 630 therebetween. The conductive pillar 630 can extend through a substrate encapsulation 632 of the embedded substrate 604 from the redistribution pad 626 to the redistribution line 628.

The substrate encapsulation 632 can be an epoxy encapsulation similar to that of the over-mold 502 described above. As will be appreciated, the conductive pillar 630 can be formed along a vertical axis for connecting conductive components at different points along the vertical axis. The redistribution line 628 can be formed along a horizontal axis for connecting conductive components at different points along the horizontal axis.

The redistribution line 628 can fan out a dense input-output array 634 from an embedded chip active side 636 of an embedded chip 638. The embedded chip 638 can be an application specific integrated circuit for providing an analog front-end for the optical sensor 504.

The embedded chip 638 can include analog signal conditioning circuitry implementing sensitive analog amplifiers. As will be appreciated, providing the embedded chip 638 in the form of an ASIC can provide a configurable and flexible electronics functional block and provide hardware modularity in the embedded substrate 604.

The embedded chip active side 636 can be a side of the embedded chip 638 having active components, such as diodes and transistors, formed thereon. The embedded chip active side 636 is illustratively depicted as facing down toward the redistribution line 628 and the bottom of the embedded substrate 604.

The embedded chip 638 can be affixed to a die pad 640 with an embedded chip die attach material 642. The die pad 640 can provide structural stability for the embedded chip 638 during the manufacturing process of the embedded substrate 604 as well as providing a thermally conductive heat sink to draw heat out and away from the embedded chip 638. The substrate encapsulation 632 is depicted encapsulating the conductive pillar 630, the redistribution line 628, the embedded chip 638, and portions of the die pad 640.

The redistribution line 628 is shown fully encapsulated from the substrate encapsulation 632 leaving only under bump material 644 exposed therefrom. The under bump material 644 can support the formation of external interconnects 646 for connection of the packaging system 500 to external components.

Figure 7:
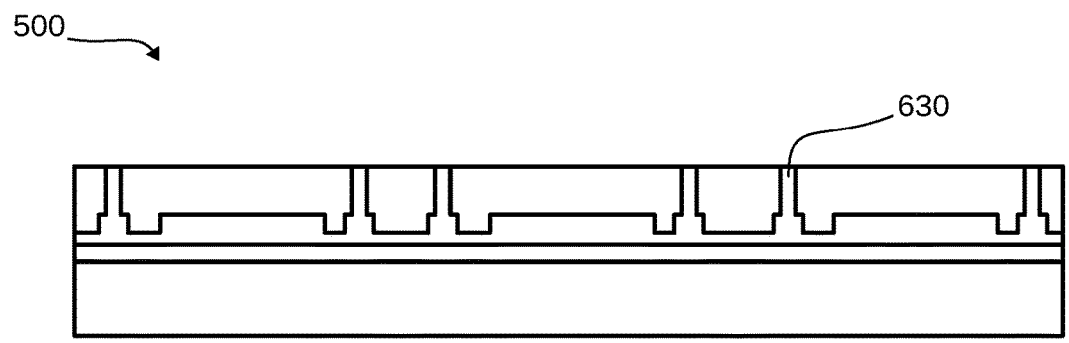
FIG. 7 is a cross-sectional view of the packaging system of FIG. 5 after a conductor plating phase of manufacture.

Referring now to FIG. 7, therein is shown a cross-sectional view of the packaging system 500 of FIG. 5 after a conductor plating phase of manufacture. The conductor plating phase of manufacture can include the formation of the conductive pillars 630.

Figure 8:
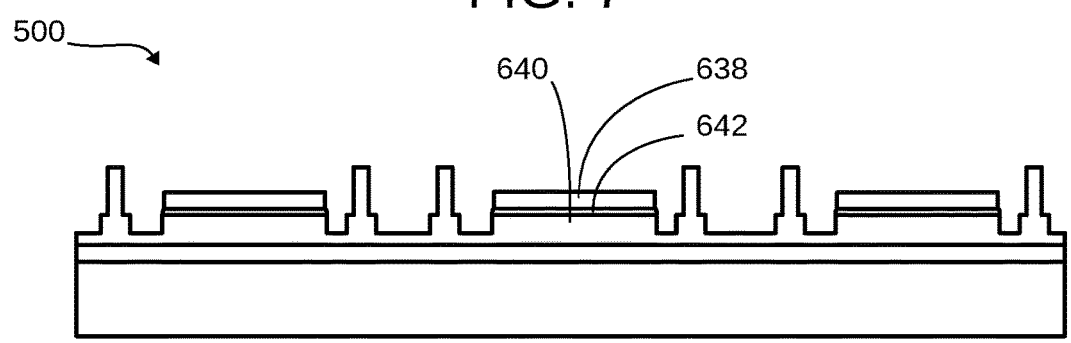
FIG. 8 is a cross-sectional view of the packaging system of FIG. 5 after a die attach phase of manufacture.

Referring now to FIG. 8, therein is shown a cross-sectional view of the packaging system 500 of FIG. 5 after a die attach phase of manufacture. During the die attach phase of manufacture, the embedded chip 638 can be coupled to the die pad 640 with the embedded chip die attach material 642.

Figure 9:
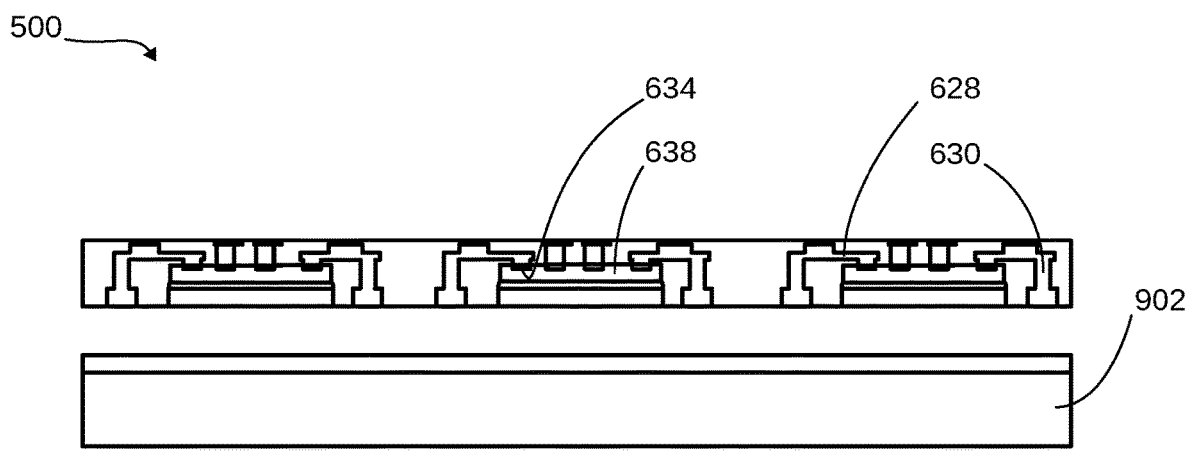
FIG. 9 is a cross-sectional view of the packaging system of FIG. 5 after a conductor etch phase of manufacture.

Referring now to FIG. 9, therein is shown a cross-sectional view of the packaging system 500 of FIG. 5 after a conductor etch phase of manufacture. As can be seen, the redistribution line 628 has been formed coupling the conductive pillar 630 with the input-output array 634 of the embedded chip 638, the carrier 902 has been detached, and copper has been etched.

Figure 10:
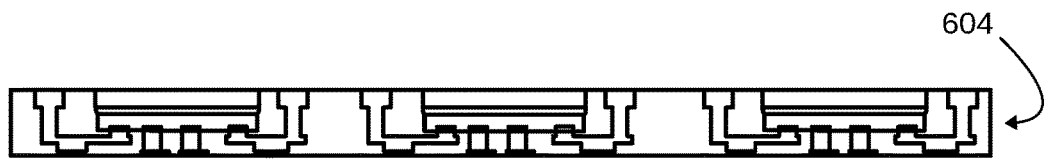
FIG. 10 is a cross-sectional view of the packaging system of FIG. 5 after a shipping phase of manufacture.

Referring now to FIG. 10, therein is shown a cross-sectional view of the packaging system 500 of FIG. 5 after a shipping phase of manufacture. As will be appreciated, the embedded substrate 604 can be completed at this manufacturing phase and can be shipped in a stable state for further processing.

Figure 11:
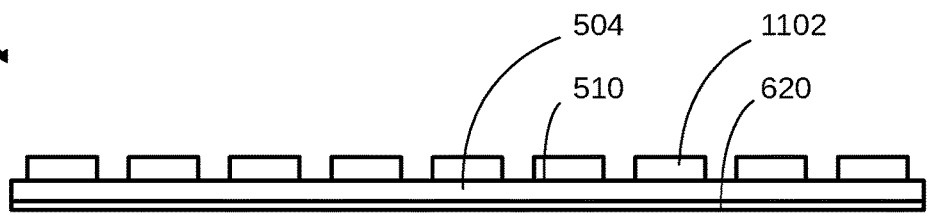
FIG. 11 is a cross-sectional view of the packaging system of FIG. 5 after a photo-sensitive material patterning phase of manufacture.

Referring now to FIG. 11, therein is shown a cross-sectional view of the packaging system 500 of FIG. 5 after a photo-sensitive material patterning phase of manufacture. The optical sensor 504 is depicted formed and provided together with other optical sensors.

The optical sensor 504 is depicted including the die attach material 620 formed to cover an inactive side of the optical sensor 504 while a patterned layer of photo sensitive material 1102 is deposited on the active optical side 510 of the optical sensor 504. The photo sensitive material 1102 can be deposited on an optical sensing area of the optical sensor 504 and then removed from the areas outside the optical sensing area with a developer. For the purposes of this application, the photo sensitive material 1102 is defined as a dual state, light sensitive material, such as photo resist or dry-film photo resist.

For example, the process of applying the photo sensitive material 1102 during a photo lithography process can begin by coating a substrate with a light-sensitive organic material, the photo sensitive material 1102. A patterned mask can then be applied to the surface of the photo sensitive material 1102 in order to block light, so that only unmasked regions of the photo sensitive material 1102 will be exposed to light. A solvent, called a developer, can then be used to remove portions of the photo sensitive material 1102.

The photo sensitive material 1102 can generally be of two types, a positive photo sensitive material and a negative photo sensitive material. When the photo sensitive material 1102 is a positive photo sensitive material, the photo sensitive material is degraded by light and the developer will dissolve away the regions that were exposed to light, leaving behind a coating where the mask was placed.

When the photo sensitive material 1102 is a negative photo sensitive material, the photo sensitive material is strengthened by light, through polymerization or cross-linking, and the developer will dissolve away only the regions that were not exposed to light, leaving behind a coating in areas where the mask was not placed.

Figure 12:
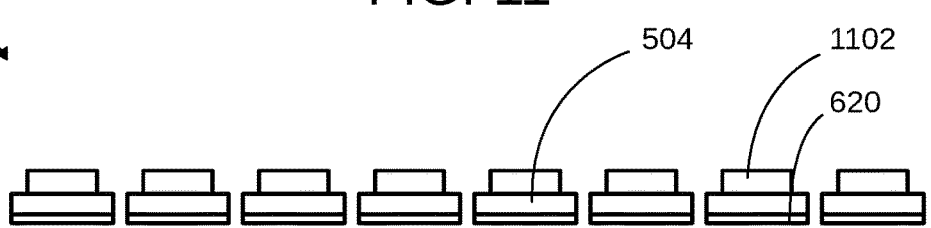
FIG. 12 is a cross-sectional view of the packaging system of FIG. 5 after an optical die dicing phase of manufacture.

Referring now to FIG. 12, therein is shown a cross-sectional view of the packaging system 500 of FIG. 5 after an optical die dicing phase of manufacture. The optical sensor 504 are shown having the photo sensitive material 1102 and the die attach material 620 coupled to each of the optical sensor 504, while the optical sensor 504 are individually diced.

Figure 13:
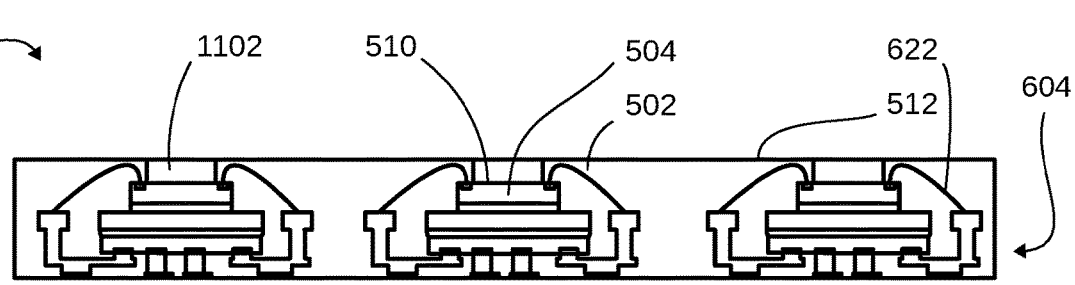
FIG. 13 is a cross-sectional view of the packaging system of FIG. 5 after a molding phase of manufacture.

Referring now to FIG. 13, therein is shown a cross-sectional view of the packaging system 500 of FIG. 5 after a molding phase of manufacture. The packaging system 500 is depicted with the optical sensor 504 affixed and mounted to the embedded substrate 604, the bond wires 622 formed to couple the optical sensor 504 to the embedded substrate 604, and the over-mold 502 formed to encapsulate the optical sensor 504, the bond wires 622, and side portions of the photo sensitive material 1102. The over-mold 502 can be formed in direct contact with the photo sensitive material 1102 from the active optical side 510 to the top surface 512 of the over-mold 502. The over-mold 502 can be co-planar with the top surface of the photo sensitive material 1102.

Figure 14:
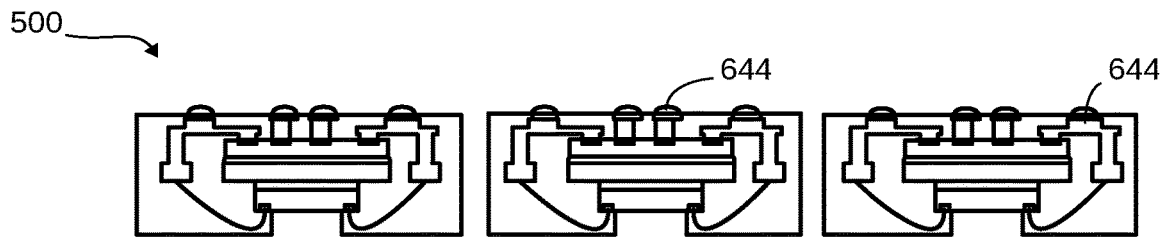
FIG. 14 is a cross-sectional view of the packaging system of FIG. 5 after a package dicing phase of manufacture.

Referring now to FIG. 14, therein is shown a cross-sectional view of the packaging system 500 of FIG. 5 after a package dicing phase of manufacture. The individual packaging systems 500 are shown diced and separated having the external interconnects 646 formed on the under bump material 644 prior to dicing.

Figure 15:
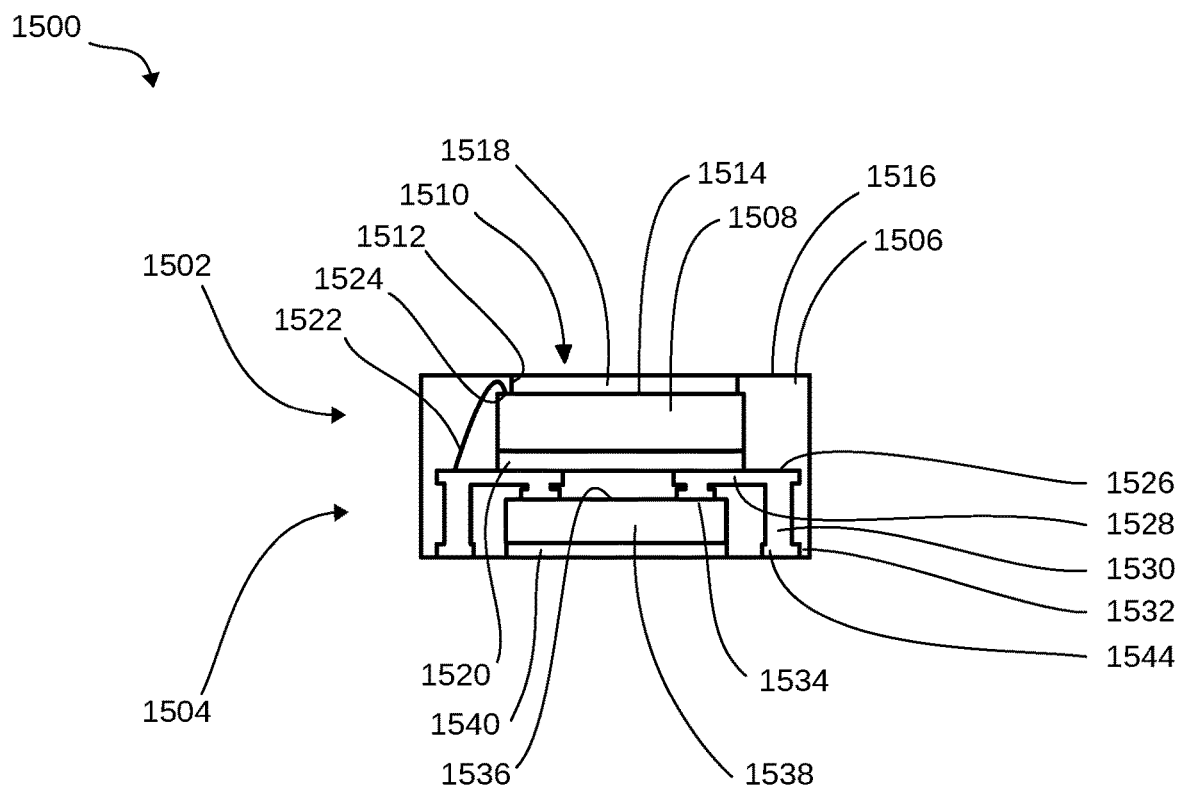
FIG. 15 is a cross-sectional view of the packaging system in a third embodiment after a molding phase of manufacture.

Referring now to FIG. 15, therein is shown a cross-sectional view of the packaging system 1500 in a third embodiment after a molding phase of manufacture. The packaging system 1500 is depicted having an optical sensor module 1502 formed above an embedded substrate 1504. The optical sensor module 1502 can include an over-mold 1506 partially encapsulating an optical sensor 1508.

The optical sensor 1508 is exposed from within a sensing window 1510 of the over-mold 1506. The sensing window 1510 can expose the optical sensor 1508 between vertically extended borders 1512. The vertically extended borders 1512 can extend from the active optical side 1514 of the optical sensor 1508 to a top surface 1516 of the over-mold 1506.

The over-mold 1506 can be an epoxy encapsulation including a blend of solid epoxy resins, hardeners, flame retardants, fillers, and other additives. The over-mold 1506 can be molded to form the vertically extended border 1512 surrounding the sensing window 1510 for exposing the active optical side 1514 therethrough.

The optical sensor 1508 can be a photoconductive sensor detecting a change of incident light with a change of resistance, a photovoltaic cell detecting incident light with a change in output voltage, a photodiode detecting an amount of incident light with a change in output current, or a combination thereof. It is alternatively contemplated, for example, that multiple light sensors and light sources could be implemented without deviating from the packaging system 100 as disclosed.

The active optical side 1514 can be one side of the optical sensor 1508 having active components such as transistors and diodes formed thereon. The active optical side 1514 is depicted facing up in the same direction as the top surface 1516 of the over-mold 1506. It is alternatively contemplated that the optical sensor 1508 could include the active optical side 1514 facing down toward the embedded substrate 1504, for example when the optical sensor 1508 is configured to sense longer wavelengths propagating through the body material of the optical sensor 1508.

The top surface 1516 can be a planar surface parallel to the active optical side 1514 of the optical sensor 1508. The vertically extended borders 1512 around the sensing window 1510 are illustratively depicted as extending vertically up away from the active optical side 1514.

It is contemplated that alternative embodiments could include the vertically extended border 1512 extending vertically but at an angle toward the center of the optical sensor 1508 or away from the center of the optical sensor 1508.

The vertically extended border 1512 can be formed on top of the optical sensor 1508 in direct contact with the active optical side 1514. A protective layer of photo sensitive material 1518 can be formed in direct contact with the vertically extended border 1512 and the active optical side 1514 of the optical sensor 1508.

The over-mold 1506 can be co-planar with the top surface of the photo sensitive material 1518. The photo sensitive material 1518, for example, can be patterned to cover a photo sensitive area of the optical sensor 104. For the purposes of this application, the photo sensitive material 1518 is defined as a dual state, light sensitive material, such as photo resist or dry-film photo resist.

For example, the process of applying the photo sensitive material 1518 during a photo lithography process can begin by coating a substrate with a light-sensitive organic material, the photo sensitive material 1518. A patterned mask can then be applied to the surface of the photo sensitive material 1518 in order to block light, so that only unmasked regions of the photo sensitive material will be exposed to light. A solvent, called a developer, can then be used to remove portions of the photo sensitive material 1518.

The photo sensitive material 1518 can generally be of two types, a positive photo sensitive material and a negative photo sensitive material. When the photo sensitive material 1518 is a positive photo sensitive material, the photo sensitive material 1518 is degraded by light and the developer will dissolve away the regions that were exposed to light, leaving behind a coating where the mask was placed.

When the photo sensitive material 1518 is a negative photo sensitive material, the photo sensitive 1518 material is strengthened by light through polymerization or cross-linking, and the developer will dissolve away only the regions that were not exposed to light, leaving behind a coating in areas where the mask was not placed.

The optical sensor 1508 can be affixed to the embedded substrate 1504 with a die attach material 1520. The die attach material 1520 can be a die attach adhesive such an epoxy, a polymer adhesive with thermally conductive fillers, or a eutectic die attach material.

The active optical side 1514 can be electrically coupled to the embedded substrate 1504 with bond wires 1522 extended from sensor pads 1524 on the active optical side 1514 of the optical sensor 1508 to redistribution pads 1526 exposed from the embedded substrate 1504.

It is alternatively contemplated that the bond wire 1522 could be replaced with a ball bond between the sensor pad 1524 and the redistribution pad 1526 when the optical sensor 1508 has the active optical side 1514 facing down toward the embedded substrate 1504. The over-mold 1506 is shown encapsulating the bond wires 1522, the die attach material 1520, and the optical sensor 1508 above the embedded substrate 1504.

The top surface 1516 of the over-mold 1506 is shown above the bond wires 1522 meaning that the vertically extended border 1512 extends vertically beyond the top of the bond wire 1522 to the top surface 1516 in order to form the sensing window 1510 and the over-mold 1506 fully encapsulating the bond wire 1522. The redistribution pad 1526 can be electrically coupled to a redistribution line 1528 and a conductive pillar 1530.

The conductive pillar 1530 can extend through a substrate encapsulation 1532 of the embedded substrate 1904. The substrate encapsulation 1532 can be an epoxy encapsulation similar to that of the over-mold 1506 described above. As will be appreciated, the conductive pillar 1530 can be formed along a vertical axis for connecting conductive components at different points along the vertical axis. The redistribution line 1528 can be formed along a horizontal axis for connecting conductive components at different points along the horizontal axis.

The redistribution line 1528 can fan out a dense input-output array 1534 from an embedded chip active side 1536 of an embedded chip 1538. The embedded chip 1538 can be an application specific integrated circuit for providing an analog front-end for the optical sensor 1508.

The embedded chip 1538 can include analog signal conditioning circuitry implementing sensitive analog amplifiers.

As will be appreciated, providing the embedded chip 1538 in the form of an ASIC can provide a configurable and flexible electronics functional block and provide hardware modularity in the embedded substrate 1504.

The embedded chip active side 1536 can be a side of the embedded chip 1538 having active components, such as diodes and transistors, formed thereon. The embedded chip active side 1536 is illustratively depicted as facing up toward the optical sensor module 1502.

The embedded chip 1538 can be affixed in direct contact to a die pad 1540. The die pad 1540 can provide structural stability for the embedded chip 1538 during the manufacturing process of the embedded substrate 1504 as well as providing a thermally conductive heat sink to draw heat out and away from the embedded chip 1538. The substrate encapsulation 1532 is depicted encapsulating the conductive pillar 1530, the redistribution line 1528, the embedded chip 1538, and portions of the die pad 1540.

The redistribution line 1528 is shown fully encapsulated from the substrate encapsulation 1532 leaving only under bump material 1544 exposed therefrom. The under bump material 1544 can support the formation of external interconnects for connection of the packaging system 1500 to external components.

Figure 16:
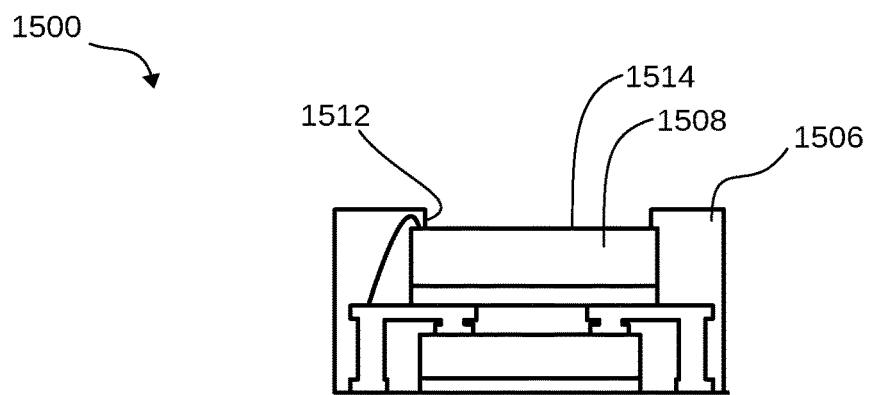
FIG. 16 is a cross-sectional view of the packaging system of FIG. 15 after a photo-sensitive material strip phase of manufacture.

Referring now to FIG. 16, therein is shown a cross-sectional view of the packaging system 1500 of FIG. 15 after a photo-sensitive material strip phase of manufacture. The photo sensitive material 1518 of FIG. 15 has been stripped from the active optical side 1514 of the optical sensor 1508 and is now depicted exposed from between the vertically extended border 1512 of the over-mold 1506.

Figure 17:
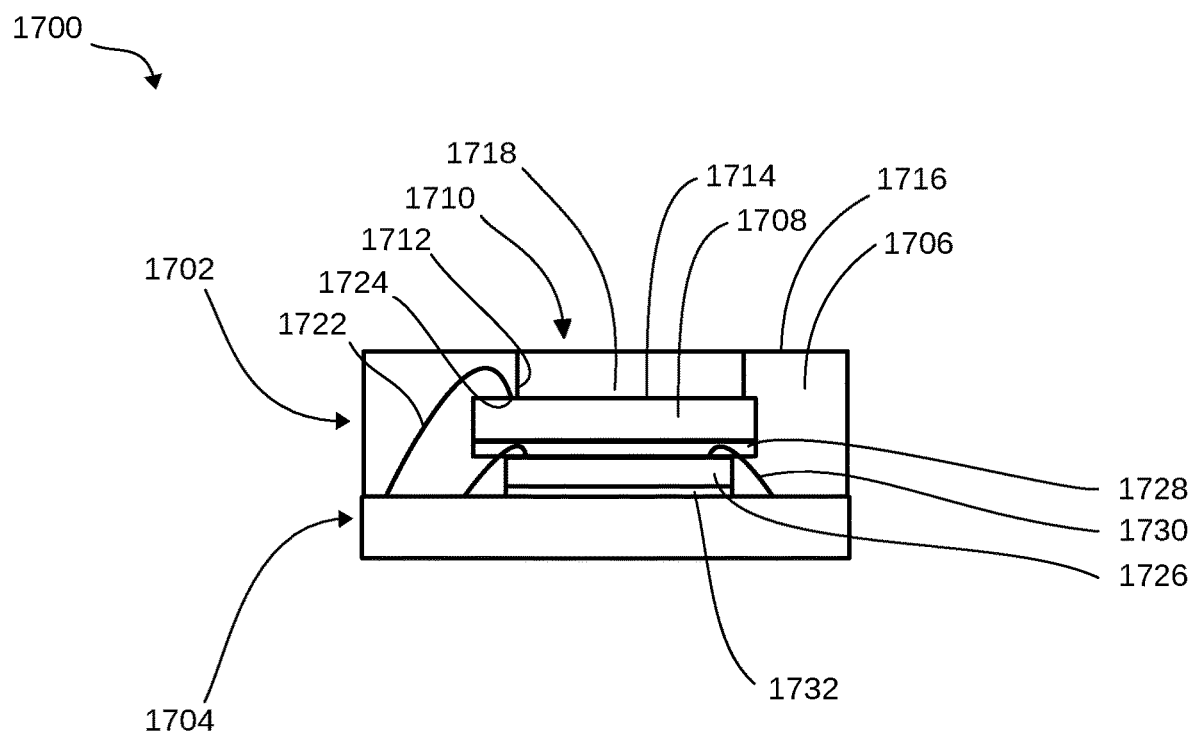
FIG. 17 is a cross-sectional view of the packaging system in a fourth embodiment after a molding phase of manufacture.

Referring now to FIG. 17, therein is shown a cross-sectional view of the packaging system 1700 in a fourth embodiment after a molding phase of manufacture. The packaging system 1700 is depicted having an optical sensor module 1702 formed above an embedded substrate 1704. The optical sensor module 1702 can include an over-mold 1706 partially encapsulating an optical sensor 1708.

The optical sensor 1708 is exposed from within a sensing window 1710 of the over-mold 1706. The sensing window 1710 can expose the optical sensor 1708 between vertically extended borders 1712. The vertically extended borders 1712 can extend from the active optical side 1714 of the optical sensor 1708 to a top surface 1716 of the over-mold 1706.

The over-mold 1706 can be an epoxy encapsulation including a blend of solid epoxy resins, hardeners, flame retardants, fillers, and other additives. The over-mold 1706 can be molded to form the vertically extended border 1712 surrounding the sensing window 1710 for exposing the active optical side 1714 therethrough.

The optical sensor 1708 can be a photoconductive sensor detecting a change of incident light with a change of resistance, a photovoltaic cell detecting incident light with a change in output voltage, a photodiode detecting an amount of incident light with a change in output current, or a combination thereof. It is alternatively contemplated, for example, that multiple light sensors and light sources could be implemented without deviating from the packaging system 100 as disclosed.

The active optical side 1714 can be one side of the optical sensor 1708 having active components such as transistors and diodes formed thereon. The active optical side 1714 is depicted facing up in the same direction as the top surface 1716 of the over-mold 1706. It is alternatively contemplated that the optical sensor 1708 could include the active optical side 1714 facing down toward the embedded substrate 1704, for example when the optical sensor 1708 is configured to sense longer wavelengths propagating through the body material of the optical sensor 1708.

The top surface 1716 can be a planar surface parallel to the active optical side 1714 of the optical sensor 1708. The vertically extended borders 1712 around the sensing window 1710 are illustratively depicted as extending vertically up away from the active optical side 1714.

It is contemplated that alternative embodiments could include the vertically extended border 1712 extending vertically but at an angle toward the center of the optical sensor 1708 or away from the center of the optical sensor 1708.

The vertically extended border 1712 can be formed on top of the optical sensor 1708 in direct contact with the active optical side 1714. A protective layer of photo sensitive material 1718 can be formed in direct contact with the vertically extended border 108 and the active optical side 110 of the optical sensor 104.

The photo sensitive material 1718, for example, can be patterned to cover a photo sensitive area of the optical sensor 104. For the purposes of this application, the photo sensitive material 1718 is defined as a dual state, light sensitive material, such as photo resist or dry-film photo resist.

For example, the process of applying the photo sensitive material 1718 during a photo lithography process can begin by coating a substrate with a light-sensitive organic material, the photo sensitive material 1718. A patterned mask can then be applied to the surface of the photo sensitive material 1718 in order to block light, so that only unmasked regions of the photo sensitive material will be exposed to light. A solvent, called a developer, can then be used to remove portions of the photo sensitive material 1718.

The photo sensitive material 1718 can generally be of two types, a positive photo sensitive material and a negative photo sensitive material. When the photo sensitive material 1718 is a positive photo sensitive material, the photo sensitive material is degraded by light and the developer will dissolve away the regions that were exposed to light, leaving behind a coating where the mask was placed.

When the photo sensitive material 1718 is a negative photo sensitive material, the photo sensitive material is strengthened by light through polymerization or cross-linking, and the developer will dissolve away only the regions that were not exposed to light, leaving behind a coating in areas where the mask was not placed.

The active optical side 1714 can be electrically coupled to the embedded substrate 1704 with bond wires 1722 extended from sensor pads 1724 on the active optical side 1714 of the optical sensor 1708 to the embedded substrate 1704. The active optical side 1714 can be electrically coupled to the embedded substrate 1704 with bond wires 1722 extended from sensor pads 1724 on the active optical side 1714 of the optical sensor 1708 to the embedded substrate 1704.

It is alternatively contemplated that the bond wire 1722 could be replaced with a ball bond when the optical sensor 1708 has the active optical side 1714 facing down toward the embedded substrate 1704. The optical sensor 1708 can be affixed to an embedded chip 1726 with a die attach material 1728. The die attach material 1728 can be a film-over-wire die attach adhesive allowing the embedded chip 1726 to be coupled to the embedded substrate 204 with embedded chip bond wires 1730 extended through the die attach material 1728.

The embedded chip 1726 can be affixed to the embedded substrate 1704 with an embedded chip die attach adhesive 1732. The over-mold 1706 is shown encapsulating the bond wires 1722, the embedded chip bond wires 1730, the embedded chip die attach adhesive 1732, the die attach material 1728, and the optical sensor 1708 above the embedded substrate 1704.

The top surface 1716 of the over-mold 1706 is shown above the bond wires 1722 meaning that the vertically extended border 1712 extends vertically beyond the top of the bond wire 1722 to the top surface 1716 in order to form the sensing window 1710 and the over-mold 1706 fully encapsulating the bond wire 1722.

The embedded chip 1726 can be an application specific integrated circuit for providing an analog front-end for the optical sensor 1708. The embedded chip 1738 can include analog signal conditioning circuitry implementing sensitive analog amplifiers. As will be appreciated, providing the embedded chip 1726 in the form of an ASIC can provide a configurable and flexible electronics functional block and provide hardware modularity in the embedded substrate 1704.

Figure 18:
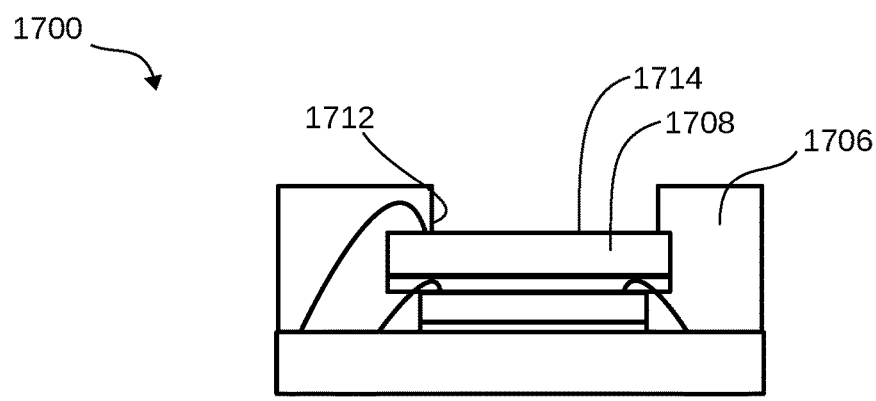
FIG. 18 is a cross-sectional view of the packaging system of FIG. 17 after a photo-sensitive material strip phase of manufacture.

Referring now to FIG. 18, therein is shown a cross-sectional view of the packaging system 1700 of FIG. 17 after a photo-sensitive material strip phase of manufacture. The photo sensitive material 1718 of FIG. 17 has been stripped from the active optical side 1714 of the optical sensor 1708 and is now depicted exposed from between the vertically extended border 1712 of the over-mold 1706.

Figure 19:
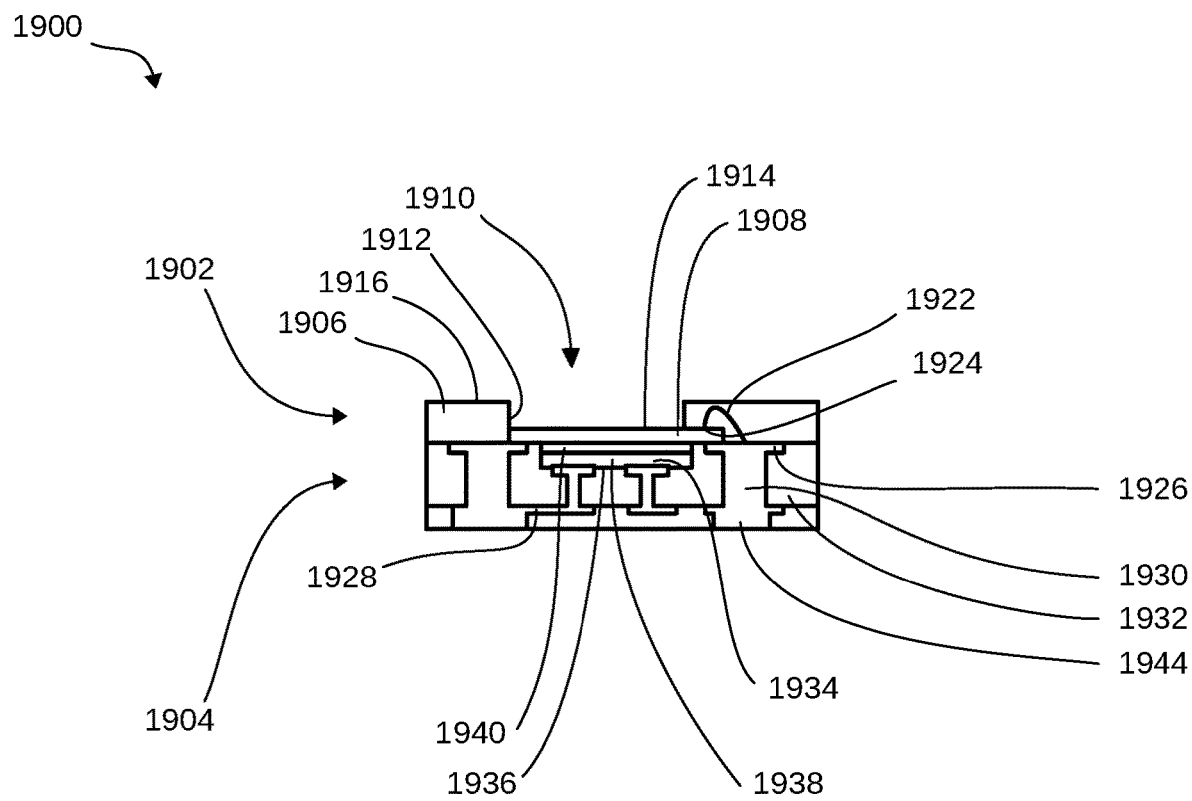
FIG. 19 is a cross-sectional view of the packaging system in a fifth embodiment.

Referring now to FIG. 19, therein is shown a cross-sectional view of the packaging system 1900 in a fifth embodiment. The packaging system 1900 is depicted having an optical sensor module 1902 formed above an embedded substrate 1904. The optical sensor module 1902 can include an over-mold 1906 partially encapsulating an optical sensor 1908.

The optical sensor 1908 is exposed from within a sensing window 1910 of the over-mold 1906. The sensing window 1910 can expose the optical sensor 1908 between vertically extended borders 1912. The vertically extended borders 1912 can extend from the active optical side 1914 of the optical sensor 1908 to a top surface 1916 of the over-mold 1906.

The over-mold 1906 can be an epoxy encapsulation including a blend of solid epoxy resins, hardeners, flame retardants, fillers, and other additives. The over-mold 1906 can be molded to form the vertically extended border 1912 surrounding the sensing window 1910 for exposing the active optical side 1914 therethrough.

The optical sensor 1908 can be a photoconductive sensor detecting a change of incident light with a change of resistance, a photovoltaic cell detecting incident light with a change in output voltage, a photodiode detecting an amount of incident light with a change in output current, or a combination thereof. It is alternatively contemplated, for example, that multiple light sensors and light sources could be implemented without deviating from the packaging system 100 as disclosed.

The active optical side 1914 can be one side of the optical sensor 1908 having active components such as transistors and diodes formed thereon. The active optical side 1914 is depicted facing up in the same direction as the top surface 1916 of the over-mold 1906. It is alternatively contemplated that the optical sensor 1908 could include the active optical side 1914 facing down toward the embedded substrate 1904, for example when the optical sensor 1908 is configured to sense longer wavelengths propagating through the body material of the optical sensor 1908.

The top surface 1916 can be a planar surface parallel to the active optical side 1914 of the optical sensor 1908. The vertically extended borders 1912 around the sensing window 1910 are illustratively depicted as extending vertically up away from the active optical side 1914.

It is contemplated that alternative embodiments could include the vertically extended border 1912 extending vertically but at an angle toward the center of the optical sensor 1908 or away from the center of the optical sensor 1908. The vertically extended border 1912 can be formed on top of the optical sensor 1908, formed to end at a corner edge of the active optical side 1914, and formed in direct contact with the active optical side 1914.

The active optical side 1914 of the optical sensor 1908 can be electrically coupled to the embedded substrate 1904 with bond wires 1922 extended from sensor pads 1924 on the active optical side 1914 of the optical sensor 1908 to redistribution pads 1926 exposed from the embedded substrate 1904.

It is alternatively contemplated that the bond wire 1922 could be replaced with a ball bond between the sensor pad 1924 and the redistribution pad 1926 when the optical sensor 1908 has the active optical side 1914 facing down toward the embedded substrate 1904. The over-mold 1906 is shown encapsulating the bond wires 1922 and the optical sensor 1908 above the embedded substrate 1904.

The top surface 1916 of the over-mold 1906 is shown above the bond wires 1922 meaning that the vertically extended border 1912 extends vertically beyond the top of the bond wire 1922 to the top surface 1916 in order to form the sensing window 1910 and the over-mold 1906 fully encapsulating the bond wire 1922. The redistribution pad 1926 can be electrically coupled to a redistribution line 1928 with a conductive pillar 1930 therebetween. The conductive pillar 1930 can extend through a substrate encapsulation 1932 of the embedded substrate 1904 from the redistribution pad 1926 to the redistribution line 1928.

The substrate encapsulation 1932 can be an epoxy encapsulation similar to that of the over-mold 502 described above. As will be appreciated, the conductive pillar 1930 can be formed along a vertical axis for connecting conductive components at different points along the vertical axis. The redistribution line 1928 can be formed along a horizontal axis for connecting conductive components at different points along the horizontal axis.

The redistribution line 1928 can fan out a dense input-output array 1934 from an embedded chip active side 1936 of an embedded chip 1938. The embedded chip 1938 can be an application specific integrated circuit for providing an analog front-end for the optical sensor 1508.

The embedded chip 1938 can include analog signal conditioning circuitry implementing sensitive analog amplifiers. As will be appreciated, providing the embedded chip 1938 in the form of an ASIC can provide a configurable and flexible electronics functional block and provide hardware modularity in the embedded substrate 1904.

The embedded chip active side 1936 can be a side of the embedded chip 1938 having active components, such as diodes and transistors, formed thereon. The embedded chip active side 1936 is illustratively depicted as facing down toward the redistribution line 1928 and the bottom of the embedded substrate 1904.

The embedded chip 1938 can be affixed in direct physical contact to a die pad 1940. The die pad 1940 can be exposed from the substrate encapsulation 1932 allowing the optical sensor 1908 to be in direct physical contact with the die pad 1940.

The die pad 1940 can provide structural stability for the embedded chip 1938 during the manufacturing process of the embedded substrate 1904 as well as providing a thermally conductive heat sink to draw heat out and away from the embedded chip 1938 and the optical sensor 1908. The substrate encapsulation 1932 is depicted encapsulating the conductive pillar 1930, the redistribution line 1928, the embedded chip 1938, and portions of the die pad 1940.

The redistribution line 1928 is shown fully encapsulated by two portions of the substrate encapsulation 1932 leaving only under bump material 1944 exposed therefrom. The under bump material 1944 can support the formation of external interconnects for connection of the packaging system 1900 to external components.

Figure 20:
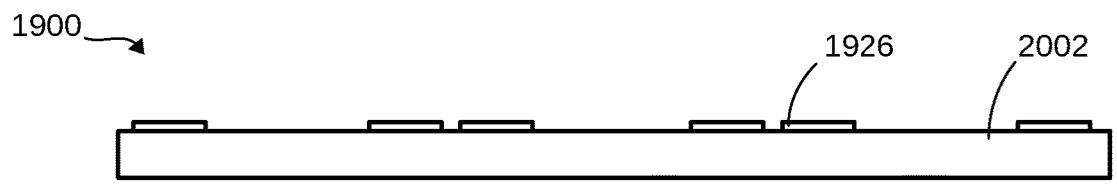
FIG. 20 is a cross-sectional view of the packaging system of FIG. 19 after a bond-pad formation phase of manufacture.

Referring now to FIG. 20, therein is shown a cross-sectional view of the packaging system 1900 of FIG. 19 after a bond-pad formation phase of manufacture. The redistribution pads 1926 of the packaging system 1900 are depicted as being formed on top of a carrier 2002. It is contemplated that the redistribution pad 1926 can be formed by electroplating, physical vapor deposition, chemical vapor deposition, or a combination thereof.

Figure 21:
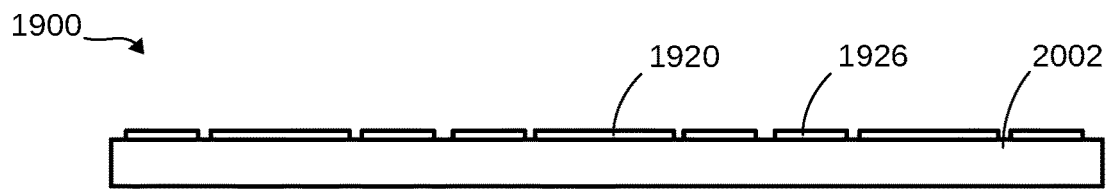
FIG. 21 is a cross-sectional view of the packaging system of FIG. 19 after an adhesive application phase of manufacture.

Referring now to FIG. 21, therein is shown a cross-sectional view of the packaging system 1900 of FIG. 19 after an adhesive application phase of manufacture. The die attach material 1920 is shown deposited on the carrier 2002 between the redistribution pad 1926.

Figure 22:
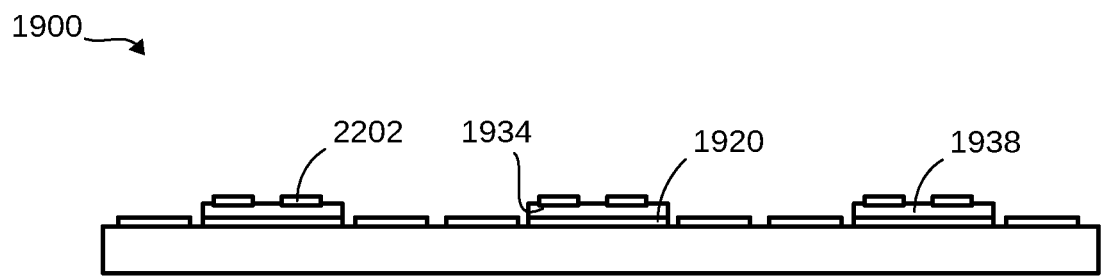
FIG. 22 is a cross-sectional view of the packaging system of FIG. 19 after a substrate die placement phase of manufacture.

Referring now to FIG. 22, therein is shown a cross-sectional view of the packaging system 1900 of FIG. 19 after a substrate die placement phase of manufacture. The embedded chip 1938 can be seen mounted to the die attach material 1920. Further, the input-output array 1934 of the embedded chip 1938 is depicted having conductive pads 2202 formed thereon.

Figure 23:
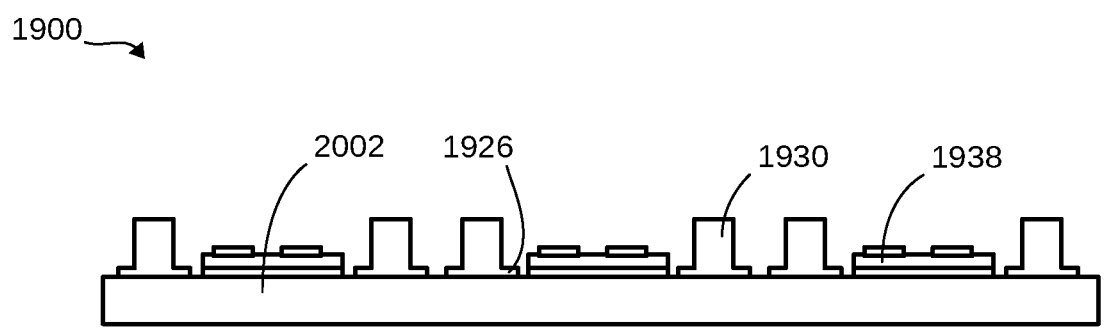
FIG. 23 is a cross-sectional view of the packaging system of FIG. 19 after a pillar formation phase of manufacture.

Referring now to FIG. 23, therein is shown a cross-sectional view of the packaging system 1900 of FIG. 19 after a pillar formation phase of manufacture. The conductive pillars 1930 can be seen extending up from the redistribution pad 1926 attached to the carrier 2002 and between the embedded chip 1938.

Figure 24:
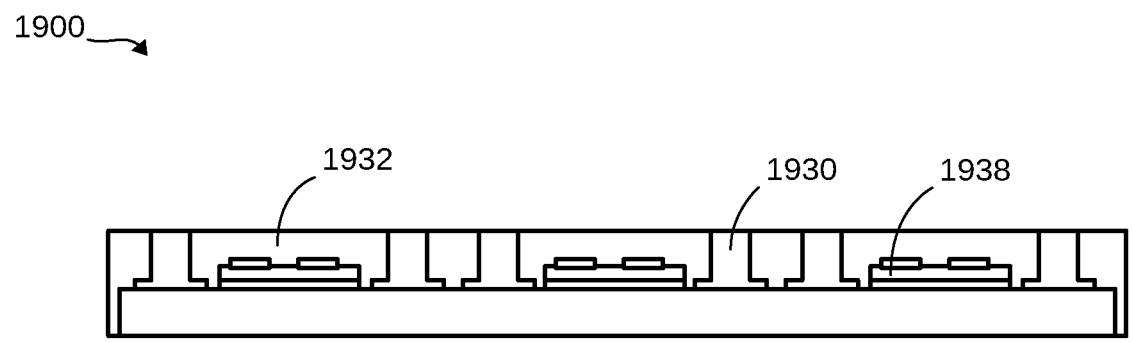
FIG. 24 is a cross-sectional view of the packaging system of FIG. 19 after a first substrate mold grind phase of manufacture.

Referring now to FIG. 24, therein is shown a cross-sectional view of the packaging system 1900 of FIG. 19 after a first substrate mold grind phase of manufacture. The substrate encapsulation 1932 can be seen to encapsulate the conductive pillars 1930 and the embedded chip 1938. The substrate encapsulation 1932 can be formed into a planar surface with the conductive pillars 1930 by grinding the substrate encapsulation 1932 along with the conductive pillars 1930 to form a planar surface.

Figure 25:
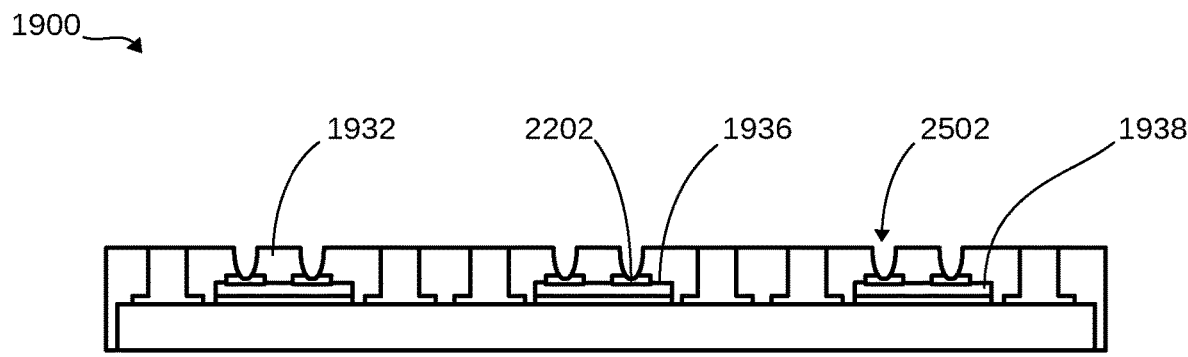
FIG. 25 is a cross-sectional view of the packaging system of FIG. 19 after a via formation phase of manufacture.

Referring now to FIG. 25, therein is shown a cross-sectional view of the packaging system 1900 of FIG. 19 after a via formation phase of manufacture. The substrate encapsulation 1932 can be shown to include vias 2502 formed therethrough exposing the conductive pads 2202 on the embedded chip active side 1936 of the embedded chip 1938. The vias 2502 can be formed by laser etching the substrate encapsulation 1932.

Figure 26:
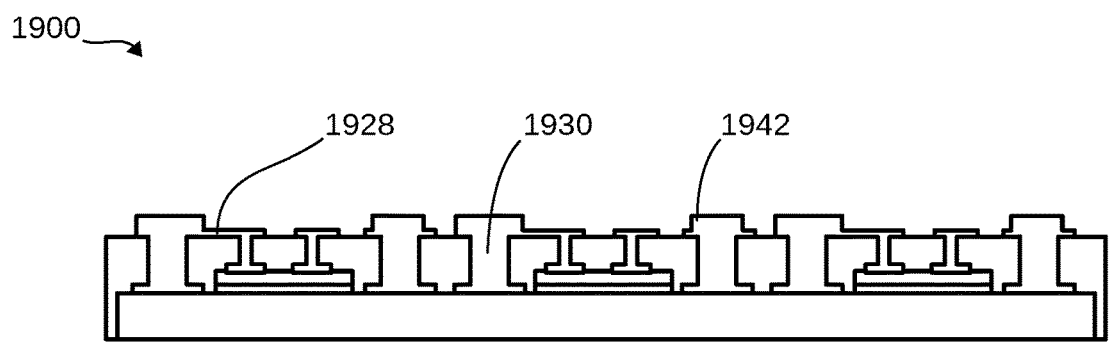
FIG. 26 is a cross-sectional view of the packaging system of FIG. 19 after a fan-out phase of manufacture.

Referring now to FIG. 26, therein is shown a cross-sectional view of the packaging system 1900 of FIG. 19 after a fan-out phase of manufacture. The vias 2502 of FIG. 25 are shown to be filled along with the formation of the redistribution line 1928 in direct contact with the conductive pillars 1930. Further, the under bump material 1942 is depicted formed the conductive pillars 1930.

Figure 27:
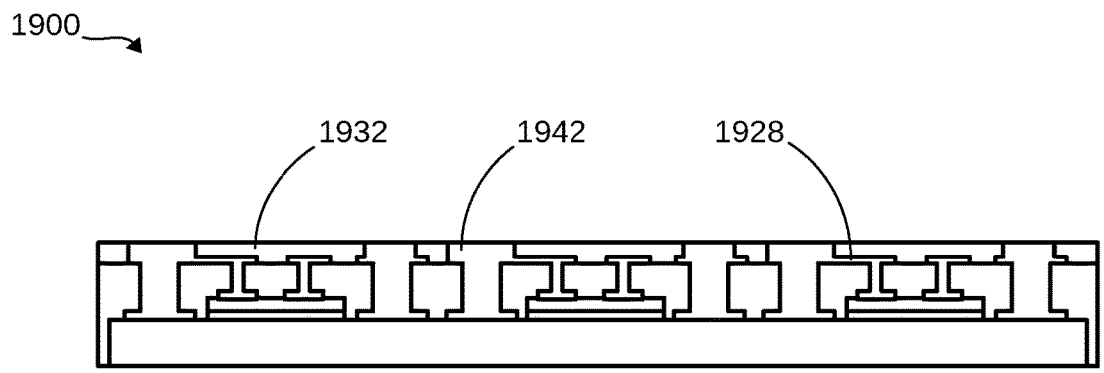
FIG. 27 is a cross-sectional view of the packaging system of FIG. 19 after a second substrate mold grind phase of manufacture.

Referring now to FIG. 27, therein is shown a cross-sectional view of the packaging system 1900 of FIG. 19 after a second substrate mold grind phase of manufacture. The substrate encapsulation 1932 can be seen to encapsulate the under bump material 1942 and the redistribution line 1928. The substrate encapsulation 1932 can be formed into a planar surface with the under bump material 1942 by grinding the substrate encapsulation 1932 along with the under bump material 1942 to form a planar surface.

Figure 28:
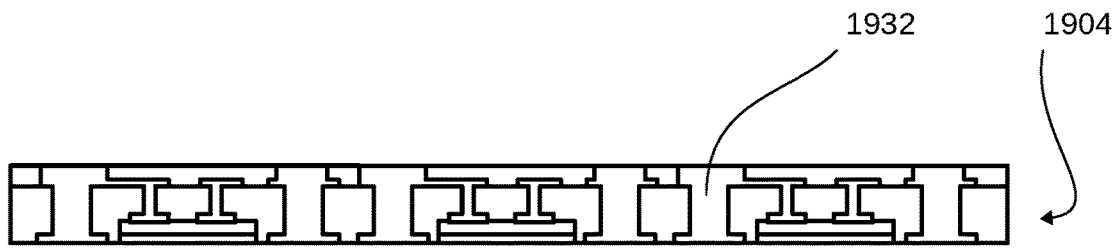
FIG. 28 is a cross-sectional view of the packaging system of FIG. 19 after a de-carrier phase of manufacture.

Referring now to FIG. 28, therein is shown a cross-sectional view of the packaging system 1900 of FIG. 19 after a de-carrier phase of manufacture. The embedded substrates 1904 are shown having the carrier 2002 of FIG. 20 removed from the substrate encapsulation 1932.

Figure 29:
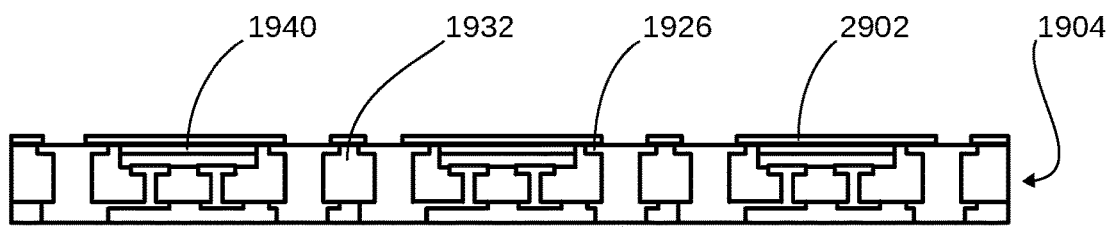
FIG. 29 is a cross-sectional view of the packaging system of FIG. 19 after a solder mask phase of manufacture.

Referring now to FIG. 29, therein is shown a cross-sectional view of the packaging system 1900 of FIG. 19 after a solder mask phase of manufacture. The embedded substrate 1904 is depicted having a solder mask 2902 deposited thereon. The solder mask 2902 can be deposited on the die pads 1940, on the substrate encapsulation 1932, and on the redistribution pads 1926. Portions of the redistribution pads 1926 are exposed from the solder mask 2902 so that the surface of the redistribution pads 1926 can be finished for wire-bonding. For example, the surface of the redistribution pads 1926 can include a universal electroless nickel electroless palladium immersion gold (ENEPIG).

Figure 30:
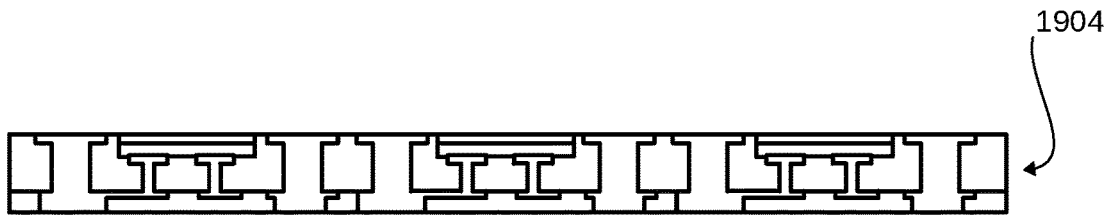
FIG. 30 is a cross-sectional view of the packaging system of FIG. 19 after a shipping phase of manufacture.

Referring now to FIG. 30, therein is shown a cross-sectional view of the packaging system 1900 of FIG. 19 after a shipping phase of manufacture. It is contemplated that the embedded substrates 1904 of the packaging system 1900 can be finished and shipped in a stable condition for future processing at different locations. It has been discovered that the embedded substrates 1904 could be tested prior to or after shipping to ensure only known good embedded substrates 1904 are used.

Figure 31:
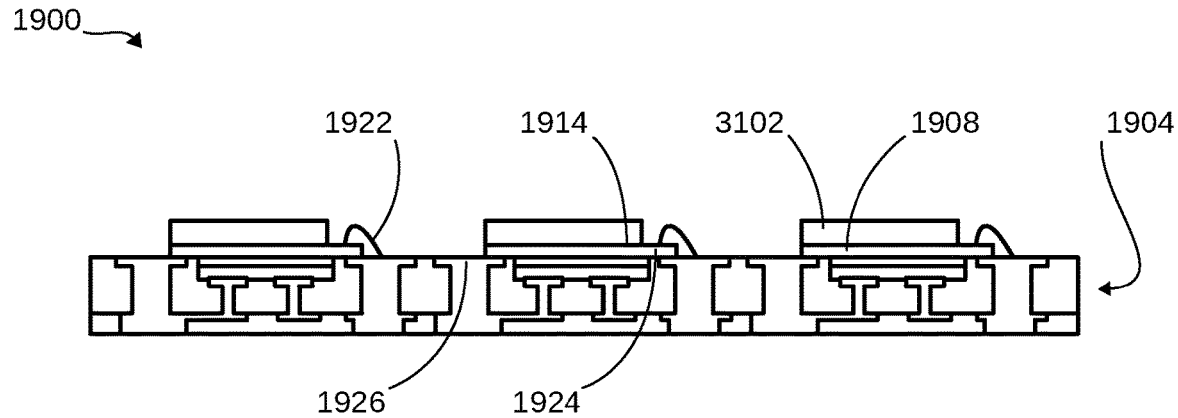
FIG. 31 is a cross-sectional view of the packaging system of FIG. 19 after a wire bonding phase of manufacture.

Referring now to FIG. 31, therein is shown a cross-sectional view of the packaging system 1900 of FIG. 19 after a wire bonding phase of manufacture. The optical sensor 1908 is depicted including a photo sensitive material 3102 deposited on the active optical side 1914. For the purposes of this application, the photo sensitive material 3102 is defined as a dual state, light sensitive material, such as photo resist or dry-film photo resist.

For example, the process of applying the photo sensitive material 3102 during a photo lithography process can begin by coating a substrate with a light-sensitive organic material, the photo sensitive material 3102. A patterned mask can then be applied to the surface of the photo sensitive material 3102 in order to block light, so that only unmasked regions of the photo sensitive material will be exposed to light. A solvent, called a developer, can then be used to remove portions of the photo sensitive material 3102.

The photo sensitive material 3102 can generally be of two types, a positive photo sensitive material and a negative photo sensitive material. When the photo sensitive material 3102 is a positive photo sensitive material, the photo sensitive material is degraded by light and the developer will dissolve away the regions that were exposed to light, leaving behind a coating where the mask was placed.

When the photo sensitive material 3102 is a negative photo sensitive material, the photo sensitive material is strengthened by light, by polymerization or cross-linking, and the developer will dissolve away only the regions that were not exposed to light, leaving behind a coating in areas where the mask was not placed. It is contemplated that the photo sensitive material 3102 can be a dry film of 100-200 μm for low-loop wire bonding of the bond wires 1922.

The bond wires 1922 can be formed coupling the sensor pads 1924 to the redistribution pads 1926 of the embedded substrates 1904. As will be appreciated, the optical sensors 1908 can be positioned to cover the die pads 1940 and even to extend to cover portions of the redistribution pads 1926.

Figure 32:
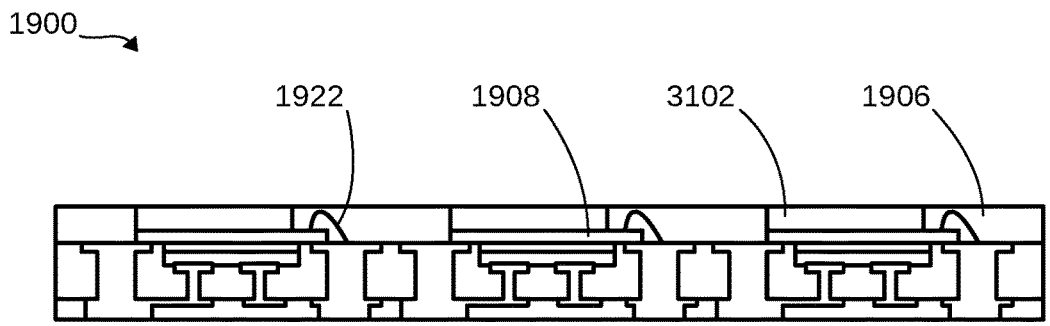
FIG. 32 is a cross-sectional view of the packaging system of FIG. 19 after an over-molding phase of manufacture.

Referring now to FIG. 32, therein is shown a cross-sectional view of the packaging system 1900 of FIG. 19 after an over-molding phase of manufacture. The over-mold 1906 can be seen encapsulating the bond wire 1922, the optical sensor 1908 and portions of the photo sensitive material 3102. It has been discovered that the use of the photo sensitive material 3102 decreases manufacturing costs, complexities, and tooling requirements by allowing a standard film assist transfer molding to be used, for by utilizing standard panel level packaging.

Figure 33:
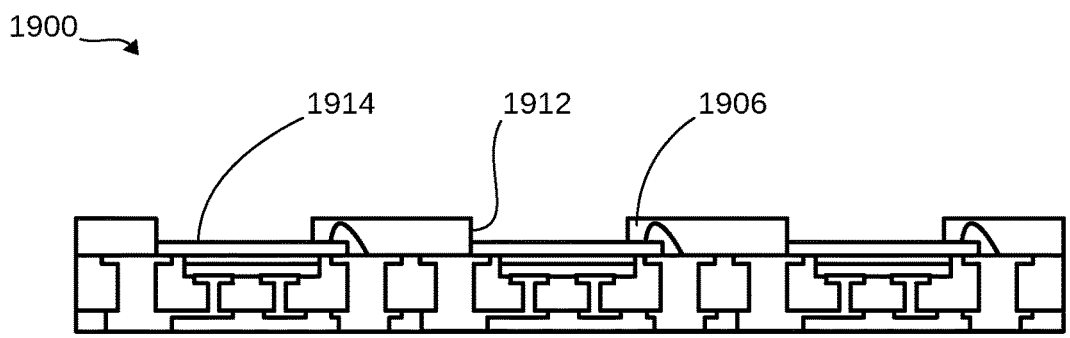
FIG. 33 is a cross-sectional view of the packaging system of FIG. 19 after a stripping phase of manufacture.

Referring now to FIG. 33, therein is shown a cross-sectional view of the packaging system 1900 of FIG. 19 after a stripping phase of manufacture. The photo sensitive material 3102 of FIG. 31 has been stripped revealing the active optical sides 1914 exposed from the vertically extended borders 1912 of the over-mold 1906.

Figure 34:
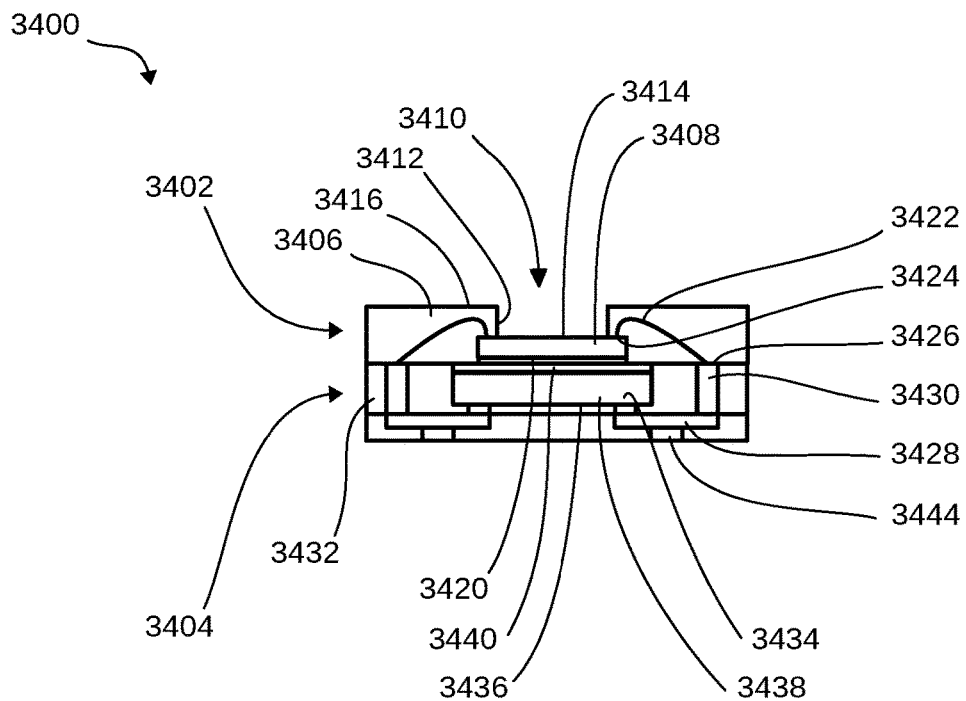
FIG. 34 is a cross-sectional view of the packaging system in a sixth embodiment.

Referring now to FIG. 34, therein is shown a cross-sectional view of the packaging system 3400 in a sixth embodiment. The packaging system 3400 is depicted having an optical sensor module 3402 formed above an embedded substrate 3404. The optical sensor module 3402 can include an over-mold 3406 partially encapsulating an optical sensor 3408.

The optical sensor 3408 is exposed from within a sensing window 3410 of the over-mold 3406. The sensing window 3410 can expose the optical sensor 3408 between vertically extended borders 3412. The vertically extended borders 3412 can extend from the active optical side 3414 of the optical sensor 3408 to a top surface 3416 of the over-mold 3406.

The over-mold 3406 can be an epoxy encapsulation including a blend of solid epoxy resins, hardeners, flame retardants, fillers, and other additives. The over-mold 3406 can be molded to form the vertically extended border 3412 surrounding the sensing window 3410 for exposing the active optical side 3414 therethrough.

The optical sensor 3408 can be a photoconductive sensor detecting a change of incident light with a change of resistance, a photovoltaic cell detecting incident light with a change in output voltage, a photodiode detecting an amount of incident light with a change in output current, or a combination thereof. It is alternatively contemplated, for example, that multiple light sensors and light sources could be implemented without deviating from the packaging system 100 as disclosed.

The active optical side 3414 can be one side of the optical sensor 3408 having active components such as transistors and diodes formed thereon. The active optical side 3414 is depicted facing up in the same direction as the top surface 3416 of the over-mold 3406. It is alternatively contemplated that the optical sensor 3408 could include the active optical side 3414 facing down toward the embedded substrate 3404, for example when the optical sensor 3408 is configured to sense longer wavelengths propagating through the body material of the optical sensor 3408.

The top surface 3416 can be a planar surface parallel to the active optical side 3414 of the optical sensor 3408. The vertically extended borders 3412 around the sensing window 3410 are illustratively depicted as extending vertically up away from the active optical side 3414.

It is contemplated that alternative embodiments could include the vertically extended border 3412 extending vertically but at an angle toward the center of the optical sensor 3408 or away from the center of the optical sensor 3408. The vertically extended border 3412 can be formed on top of the optical sensor 3408, formed to end at a corner edge of the active optical side 3414, and formed in direct contact with the active optical side 3414.

The active optical side 3414 of the optical sensor 3408 can be electrically coupled to the embedded substrate 3404 with bond wires 3422 extended from sensor pads 3424 on the active optical side 3414 of the optical sensor 3408 to redistribution pads 3426 exposed from the embedded substrate 3404.

It is alternatively contemplated that the bond wire 3422 could be replaced with a ball bond between the sensor pad 3424 and the redistribution pad 3426 when the optical sensor 3408 has the active optical side 3414 facing down toward the embedded substrate 3404. The over-mold 3406 is shown encapsulating the bond wires 3422 and the optical sensor 3408 above the embedded substrate 3404.

The top surface 3416 of the over-mold 3406 is shown above the bond wires 3422 meaning that the vertically extended border 3412 extends vertically beyond the top of the bond wire 3422 to the top surface 3416 in order to form the sensing window 3410 and the over-mold 3406 fully encapsulating the bond wire 3422. The redistribution pad 3426 can be electrically coupled to a redistribution line 3428 with a conductive pillar 3430 therebetween. The conductive pillar 3430 can extend through a substrate encapsulation 3432 of the embedded substrate 3404 from the redistribution pad 3426 to the redistribution line 3428.

The substrate encapsulation 3432 can be an epoxy encapsulation similar to that of the over-mold 502 described above. As will be appreciated, the conductive pillar 3430 can be formed along a vertical axis for connecting conductive components at different points along the vertical axis. The redistribution line 3428 can be formed along a horizontal axis for connecting conductive components at different points along the horizontal axis.

The redistribution line 3428 can fan out a dense input-output array 3434 from an embedded chip active side 3436 of an embedded chip 3438. The embedded chip 3438 can be an application specific integrated circuit for providing an analog front-end for the optical sensor 1508.

The embedded chip 3438 can include analog signal conditioning circuitry implementing sensitive analog amplifiers. As will be appreciated, providing the embedded chip 3438 in the form of an ASIC can provide a configurable and flexible electronics functional block and provide hardware modularity in the embedded substrate 3404.

The embedded chip active side 3436 can be a side of the embedded chip 3438 having active components, such as diodes and transistors, formed thereon. The embedded chip active side 3436 is illustratively depicted as facing down toward the redistribution line 3428 and the bottom of the embedded substrate 3404.

The embedded chip 3438 can be affixed in direct physical contact to an embedded die attach material 3440. The embedded die attach material 3440 can be exposed from the substrate encapsulation 3432 allowing the optical sensor 3408 to be coupled to the embedded die attach material 3440 through the die attach material 3420, the die attach material 3420 being in direct physical contact with the embedded die attach material 3440.

The embedded die attach material 3440 can provide structural stability for the embedded chip 3438 during the manufacturing process of the embedded substrate 3404 as well as providing a thermally conductive heat sink to draw heat out and away from the embedded chip 3438 and the optical sensor 3408. The substrate encapsulation 3432 is depicted encapsulating the conductive pillar 3430, the redistribution line 3428, the embedded chip 3438, and portions of the embedded die attach material 3440.

The redistribution line 3428 is shown fully encapsulated by two portions of the substrate encapsulation 3432 leaving only under bump material 3444 exposed therefrom. The under bump material 3444 can support the formation of external interconnects for connection of the packaging system 3400 to external components.

Figure 35:
FIG. 35 is a cross-sectional view of the packaging system of FIG. 34 after a first carrier providing phase of manufacture.

Referring now to FIG. 35, therein is shown a cross-sectional view of the packaging system 3400 of FIG. 34 after a first carrier providing phase of manufacture. A first carrier 3502 with a temporary material 3504 deposited thereon, can be provided for the manufacture of the packaging system 3400.

Figure 36:
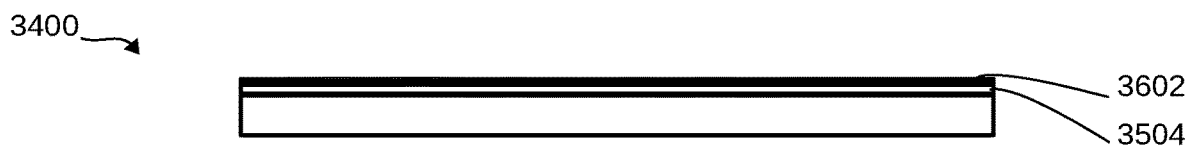
FIG. 36 is a cross-sectional view of the packaging system of FIG. 34 after a seed layer deposition phase of manufacture.

Referring now to FIG. 36, therein is shown a cross-sectional view of the packaging system 3400 of FIG. 34 after a seed layer deposition phase of manufacture. The temporary material 3504 is depicted having a seed layer 3602 formed thereon. The seed layer 3602 can be a conductive layer for enabling the construction of the conductive elements of the embedded substrate 3404 of FIG. 34.

Figure 37:
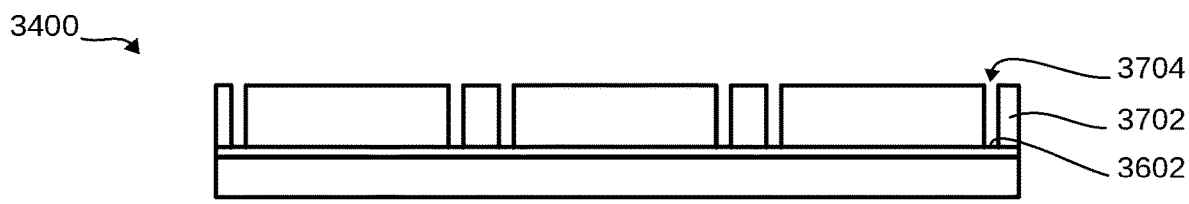
FIG. 37 is a cross-sectional view of the packaging system of FIG. 34 after a via formation phase of manufacture.

Referring now to FIG. 37, therein is shown a cross-sectional view of the packaging system 3400 of FIG. 34 after a via formation phase of manufacture. A dry film photo sensitive material 3702 can be adhered to the seed layer 3602, exposed, and developed to reveal the vias 3704. The vias 3704 are formed through the dry film photo sensitive material 3702 to expose the seed layer 3602.

Figure 38:
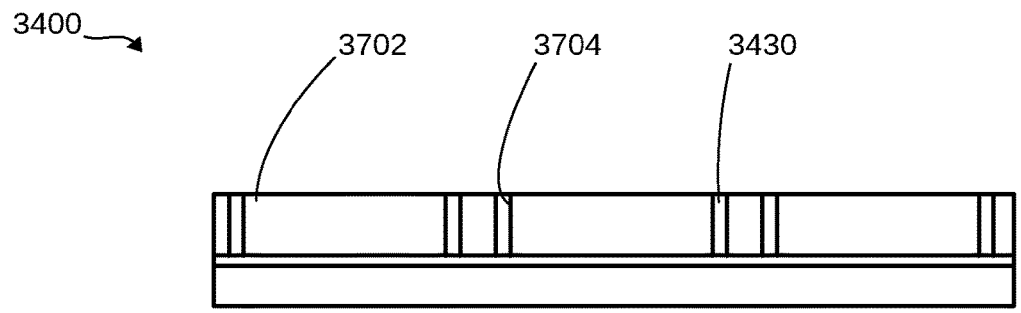
FIG. 38 is a cross-sectional view of the packaging system of FIG. 34 after a pillar plating phase of manufacture.

Referring now to FIG. 38, therein is shown a cross-sectional view of the packaging system 3400 of FIG. 34 after a pillar plating phase of manufacture. The conductive pillars 3430 are shown to be formed within the vias 3704 of the dry film photo sensitive material 3702. The conductive pillars 3430 can be formed through electroplating or deposition.

Figure 39:
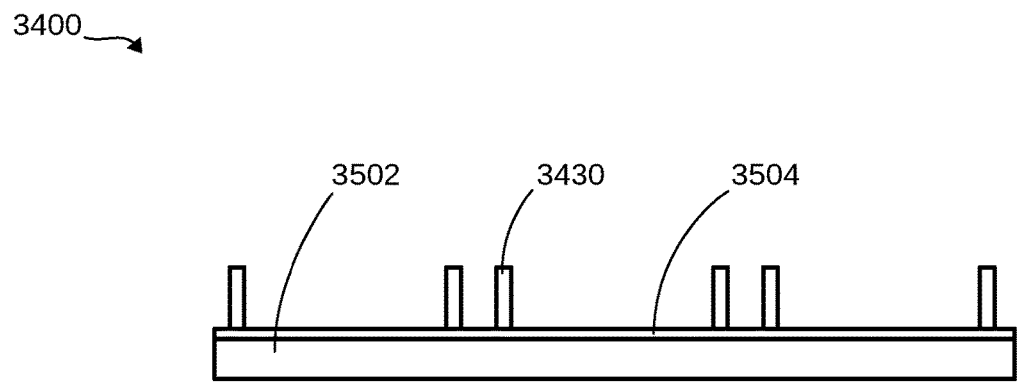
FIG. 39 is a cross-sectional view of the packaging system of FIG. 34 after a seed layer etch phase of manufacture.

Referring now to FIG. 39, therein is shown a cross-sectional view of the packaging system 3400 of FIG. 34 after a seed layer etch phase of manufacture. The seed layer 3602 of FIG. 36 has been etched and the dry film photo sensitive material 3702 of FIG. 37 has been stripped from around the conductive pillars 3430 and above the temporary material 3504 and the first carrier 3502.

Figure 40:
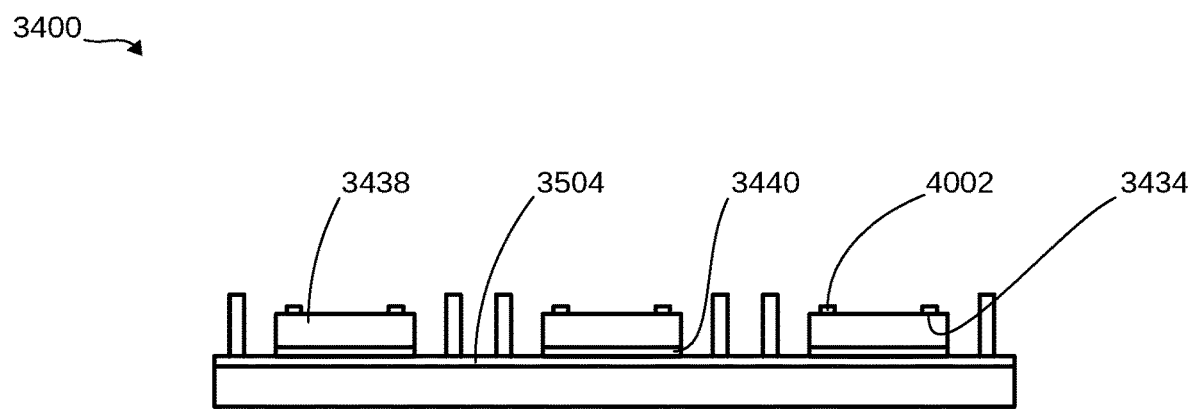
FIG. 40 is a cross-sectional view of the packaging system of FIG. 34 after a substrate chip placement phase of manufacture.

Referring now to FIG. 40, therein is shown a cross-sectional view of the packaging system 3400 of FIG. 34 after a substrate chip placement phase of manufacture. The embedded chips 3438 are depicted attached to the temporary material 3504 with the embedded die attach material 3440. The embedded chips 3438 are further depicted having conductive posts 4002 formed on the input-output arrays 3434 of the embedded chips 3438.

Figure 41:
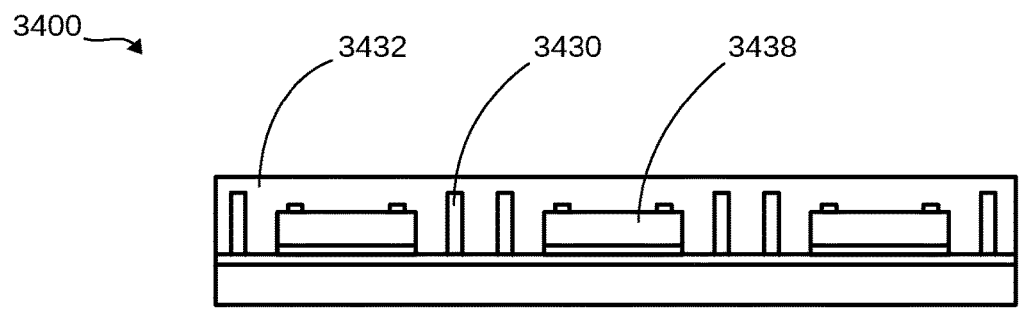
FIG. 41 is a cross-sectional view of the packaging system of FIG. 34 after a first substrate molding phase of manufacture.

Referring now to FIG. 41, therein is shown a cross-sectional view of the packaging system 3400 of FIG. 34 after a first substrate molding phase of manufacture. A portion of the substrate encapsulation 3432 can be shown encapsulating the conductive pillars 3430 and the embedded chips 3438.

Figure 42:
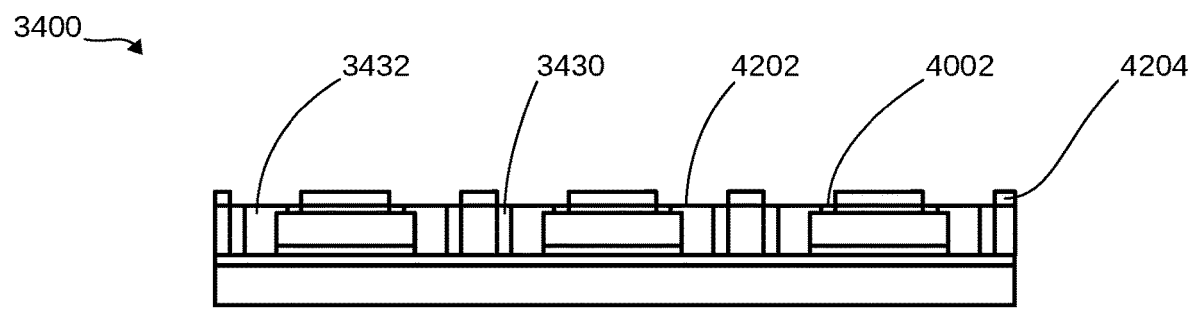
FIG. 42 is a cross-sectional view of the packaging system of FIG. 34 after a fan-out patterning phase of manufacture.

Referring now to FIG. 42, therein is shown a cross-sectional view of the packaging system 3400 of FIG. 34 after a fan-out patterning phase of manufacture. The substrate encapsulation 3432 has been ground to ensure the substrate encapsulation 3432 is coplanar with the conductive pillars 3430.

A second seed layer 4202 has been deposited as a flat layer on top of the substrate encapsulation 3432, on top of the conductive pillars 3430, and on top of the conductive posts 4002. A second dry film photo sensitive material 4204 has deposited, exposed, and developed to form a pattern on top of the second seed layer 4202 and exposing portions of the second seed layer 4202 between the conductive pillars 3430 and the conductive posts 4002.

Figure 43:
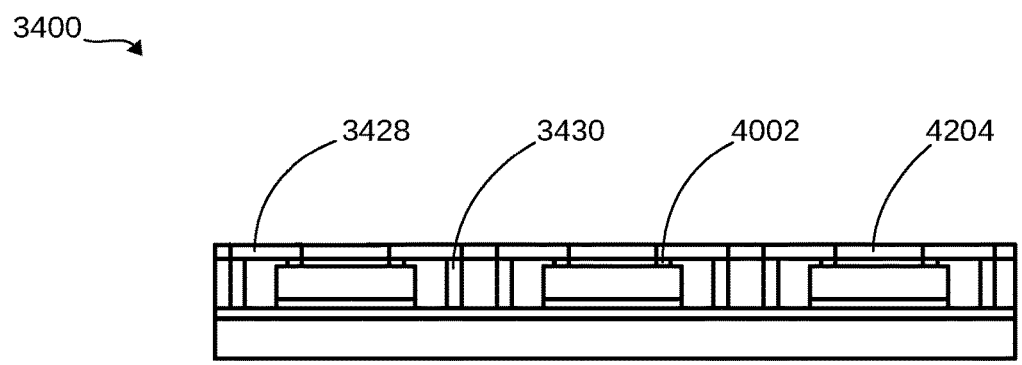
FIG. 43 is a cross-sectional view of the packaging system of FIG. 34 after a fan-out plating phase of manufacture.

Referring now to FIG. 43, therein is shown a cross-sectional view of the packaging system 3400 of FIG. 34 after a fan-out plating phase of manufacture. The redistribution lines 3428 are shown extended from the conductive pillars 3430 to the conductive posts 4002 with the second dry film photo sensitive material 4204 therebetween.

Figure 44:
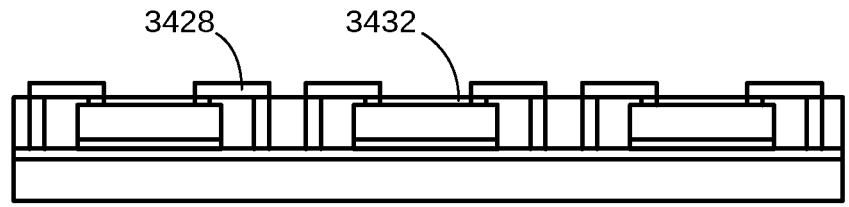
FIG. 44 is a cross-sectional view of the packaging system of FIG. 34 after a stripping phase of manufacture.

Referring now to FIG. 44, therein is shown a cross-sectional view of the packaging system 3400 of FIG. 34 after a stripping phase of manufacture. The second dry film photo sensitive material 4204 of FIG. 42 has been stripped from between the redistribution lines 3428 and the second seed layer 4202 of FIG. 42 has been etched away from the top of the substrate encapsulation 3432.

Figure 45:
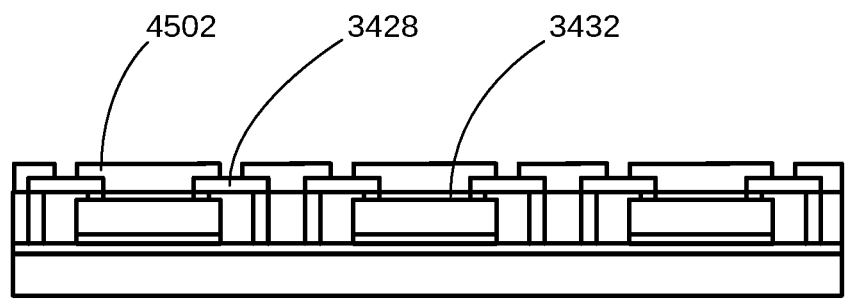
FIG. 45 is a cross-sectional view of the packaging system of FIG. 34 after a dielectric deposition phase of manufacture.

Referring now to FIG. 45, therein is shown a cross-sectional view of the packaging system 3400 of FIG. 34 after a dielectric deposition phase of manufacture. A dielectric polyimide 4502 can be formed over the redistribution line 3428 and the substrate encapsulation 3432, and can have portions of the redistribution line 3428 exposed therefrom.

Figure 46:
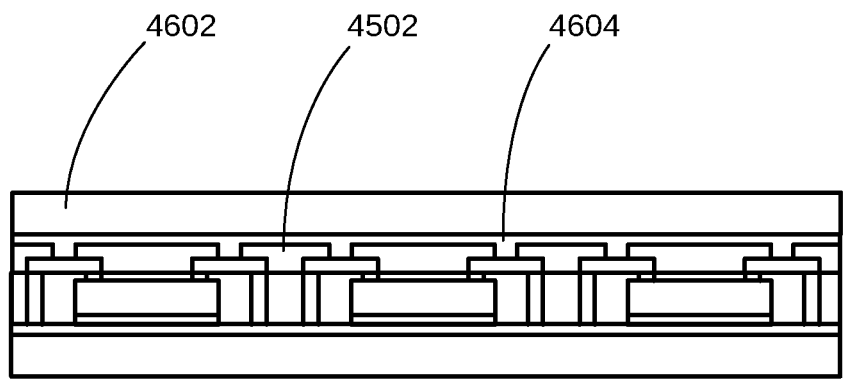
FIG. 46 is a cross-sectional view of the packaging system of FIG. 34 after a second carrier attach phase of manufacture.

Referring now to FIG. 46, therein is shown a cross-sectional view of the packaging system 3400 of FIG. 34 after a second carrier attach phase of manufacture. A second carrier 4602 is shown attached to the dielectric polyimide 4502 with a second carrier temporary material 4604.

Figure 47:
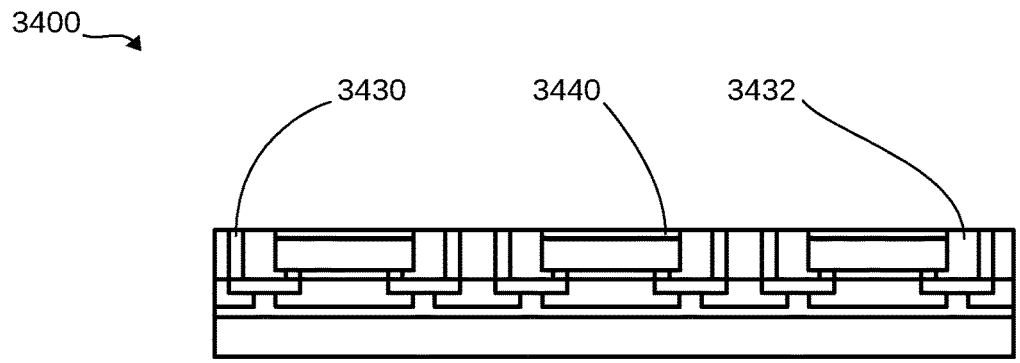
FIG. 47 is a cross-sectional view of the packaging system of FIG. 34 after a first carrier removal phase of manufacture.

Referring now to FIG. 47, therein is shown a cross-sectional view of the packaging system 3400 of FIG. 34 after a first carrier removal phase of manufacture. The first carrier 3502 of FIG. 35 along with the temporary material 3504 of FIG. 35 have been removed exposing the embedded die attach material 3440, portions of the conductive pillars 3430, and the substrate encapsulation 3432.

Figure 48:
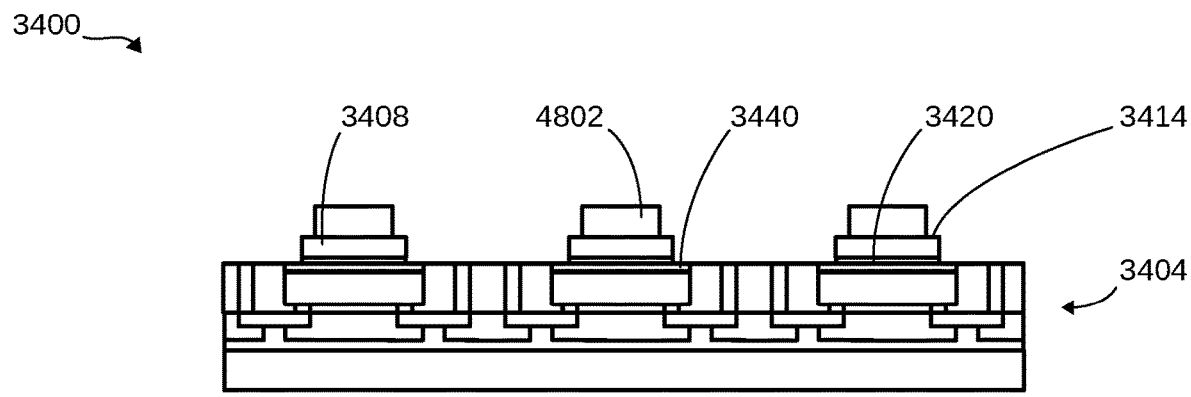
FIG. 48 is a cross-sectional view of the packaging system of FIG. 34 after an optical die attach phase of manufacture.

Referring now to FIG. 48, therein is shown a cross-sectional view of the packaging system 3400 of FIG. 34 after an optical die attach phase of manufacture. The optical sensor 3408 has been mounted to the embedded substrate 3404 with the die attach material 3420 in direct contact with the embedded die attach material 3440.

The optical sensor 3408 is further depicted including a photo sensitive material 4802 deposited on the active optical side 3414. For the purposes of this application, the photo sensitive material 4802 is defined as a dual state, light sensitive material, such as photo resist or dry-film photo resist.

For example, the process of applying the photo sensitive material 4802 during a photo lithography process can begin by coating a substrate with a light-sensitive organic material, the photo sensitive material 4802. A patterned mask can then be applied to the surface of the photo sensitive material 4802 in order to block light, so that only unmasked regions of the photo sensitive material will be exposed to light. A solvent, called a developer, can then be used to remove portions of the photo sensitive material 4802.

The photo sensitive material 4802 can generally be of two types, a positive photo sensitive material and a negative photo sensitive material. When the photo sensitive material 4802 is a positive photo sensitive material, the photo sensitive material is degraded by light and the developer will dissolve away the regions that were exposed to light, leaving behind a coating where the mask was placed.

When the photo sensitive material 4802 is a negative photo sensitive material, the photo sensitive material is strengthened by light, by polymerization or cross-linking, and the developer will dissolve away only the regions that were not exposed to light, leaving behind a coating in areas where the mask was not placed.

Figure 49:
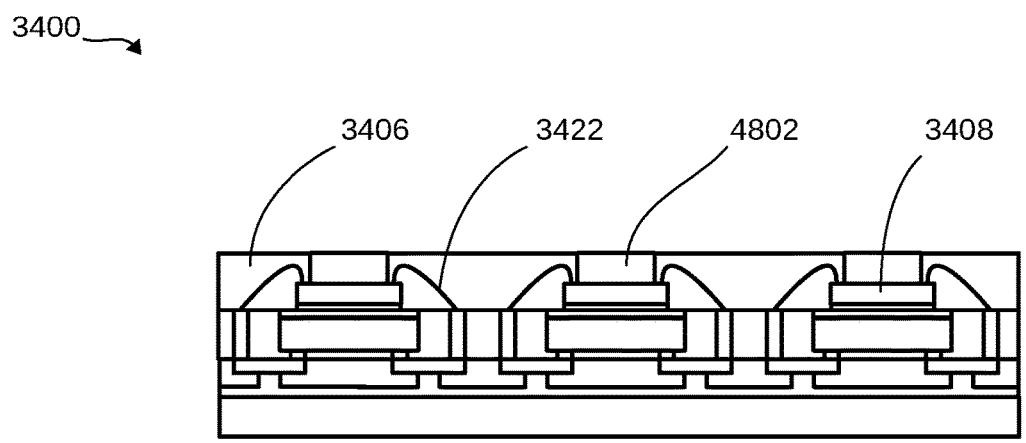
FIG. 49 is a cross-sectional view of the packaging system of FIG. 34 after an over-molding phase of manufacture.

Referring now to FIG. 49, therein is shown a cross-sectional view of the packaging system 3400 of FIG. 34 after an over-molding phase of manufacture. The over-mold 3406 is depicted formed over the bond wires 3422, the photo sensitive material 4802, and the optical sensor 3408.

Figure 50:
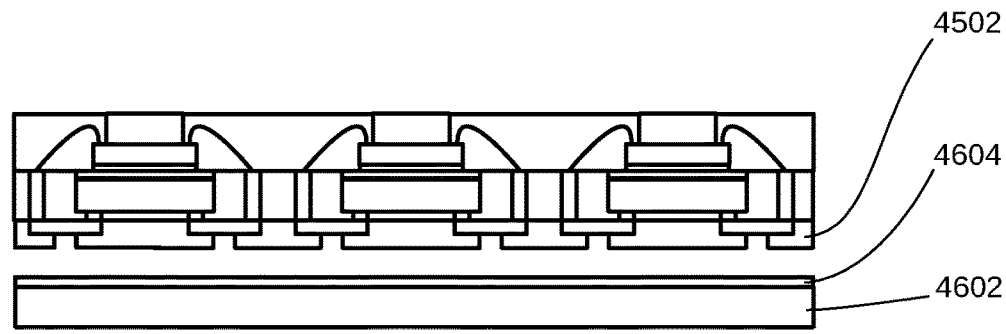
FIG. 50 is a cross-sectional view of the packaging system of FIG. 34 after a second carrier removal phase of manufacture.

Referring now to FIG. 50, therein is shown a cross-sectional view of the packaging system 3400 of FIG. 34 after a second carrier removal phase of manufacture. The second carrier 4602 along with the second carrier temporary material 4604 are shown detached from the dielectric polyimide 4502.

Figure 51:
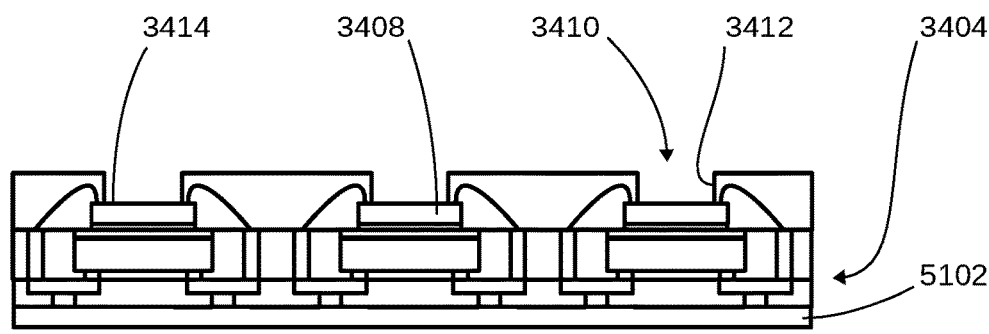
FIG. 51 is a cross-sectional view of the packaging system of FIG. 34 after a stripping phase of manufacture.

Referring now to FIG. 51, therein is shown a cross-sectional view of the packaging system 3400 of FIG. 34 after a stripping phase of manufacture. The photo sensitive material 4802 of FIG. 48 has been stripped from within the sensing window 3410 exposing the active optical side 3414 of the optical sensor 3408 from between the vertically extended border 3412. A backside protective tape 5102 has been applied to the bottom of the embedded substrate 3404.

Figure 52:
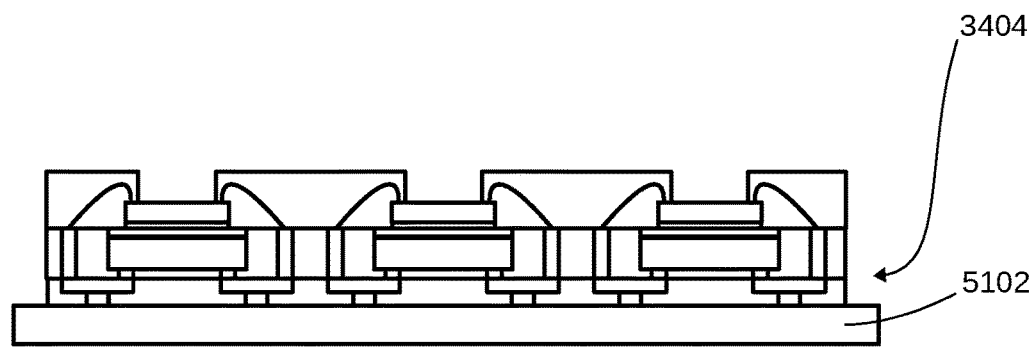
FIG. 52 is a cross-sectional view of the packaging system of FIG. 34 after a dicing tape attachment phase of manufacture.

Referring now to FIG. 52, therein is shown a cross-sectional view of the packaging system 3400 of FIG. 34 after a dicing tape attachment phase of manufacture. The backside protective tape 5102 of FIG. 51 has been removed and replaced with a dicing tape 5202 below the embedded substrate 3404.

Figure 53:
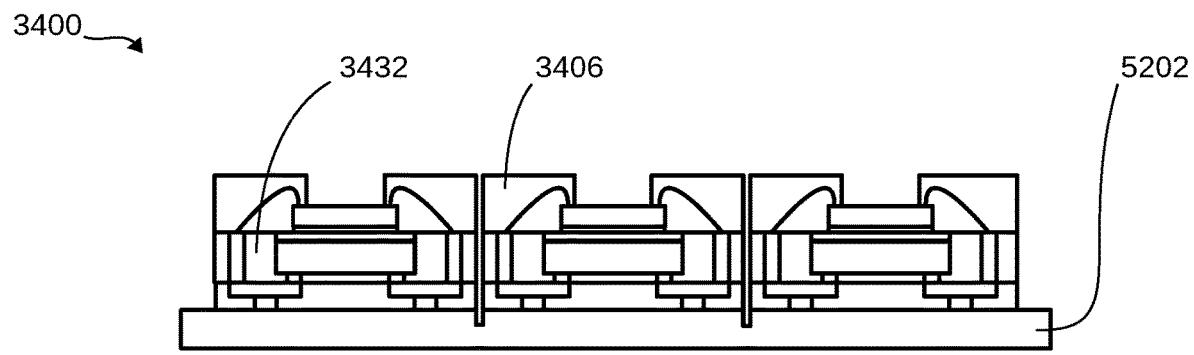
FIG. 53 is a cross-sectional view of the packaging system of FIG. 34 after a dicing phase of manufacture.

Referring now to FIG. 53, therein is shown a cross-sectional view of the packaging system 3400 of FIG. 34 after a dicing phase of manufacture. The packaging systems 3400 are shown individually diced through the over-mold 3406, the substrate encapsulation 3432, and into the dicing tape 5202.

Figure 54:
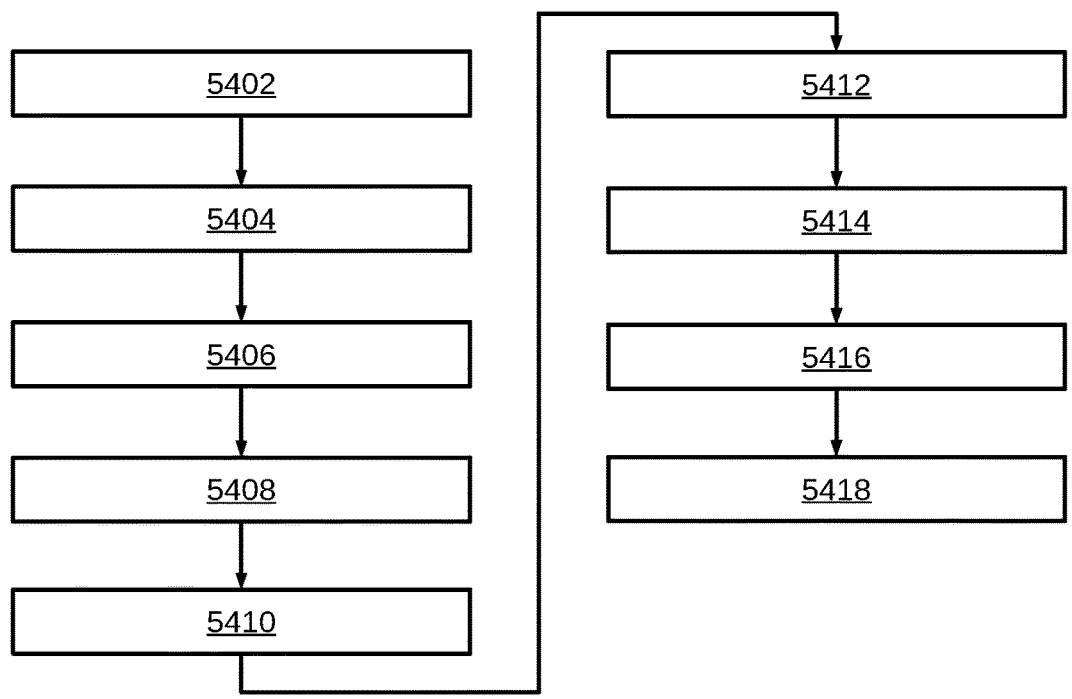
FIG. 54 is a flow chart of a manufacturing method for manufacturing the packaging system.

Referring now to FIG. 54, therein is shown a flow chart 5400 of a manufacturing method for manufacturing the packaging system. The manufacturing method can include providing an embedded substrate, the embedded substrate including a substrate encapsulation and an embedded chip coupled to a redistribution pad with a redistribution line connecting therebetween, the substrate encapsulation encapsulating the embedded chip and the redistribution line in a block 5402; depositing a photo sensitive material on an optical sensor in a block 5404; exposing portions of the photo sensitive material to light in a block 5406; developing the photo sensitive material to remove the photo sensitive material not covering a photo sensitive area of an active optical side of the optical sensor in a block 5408; mounting the optical sensor to the embedded substrate in a block 5410; wire-bonding the optical sensor to the embedded substrate with a bond wire connected from a sensor pad on the active optical side to the redistribution pad in a block 5412; encapsulating the optical sensor, the bond wire, and the photo sensitive material with an over-mold, the over-mold formed with a top surface co-planar to a surface of the photo sensitive material, the over-mold forming a vertically extended border around the photo sensitive material and around the optical sensing area, the over-mold formed above the bond wire, and the over-mold formed covering portions of the active optical side in a block 5414; stripping the photo sensitive material from the active optical side and from between the vertically extended border leaving the active optical side exposed from within a sensing window, the sensing window bordered by the vertically extended border in a block 5416; and dicing the over-mold and the substrate encapsulation in a block 5418.

Thus, it has been discovered that the optical sensor packaging system furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

While the optical sensor packaging system has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

What is claimed is:

1. A method of manufacturing an optical sensor packaging system comprising:
   providing a substrate, the substrate including a redistribution pad;
   mounting an optical sensor to the substrate, the optical sensor including a photo sensitive material formed on a photo sensitive area of an active optical side of the optical sensor;
   wire-bonding the optical sensor to the substrate with a first bond wire connected from the active optical side to the redistribution pad;
   encapsulating the optical sensor, the first bond wire, and the photo sensitive material with an over-mold, the over-mold formed with a top surface co-planar to a surface of the photo sensitive material, the over-mold forming a vertically extended border around the photo sensitive material and around the photo sensitive area, and the over-mold formed above the first bond wire; and
   stripping the photo sensitive material from the active optical side and from between the vertically extended border leaving the active optical side exposed from within a sensing window, the sensing window bordered by the vertically extended border.

2. The method of claim 1 further comprising:
   mounting a second optical sensor to the substrate;
   wire-bonding the second optical sensor to the substrate; and
   wherein encapsulating the optical sensor further includes encapsulating the second optical sensor with the over-mold.

3. The method of claim 1 wherein mounting the optical sensor to the substrate includes mounting the optical sensor to the substrate with a die attach material.

4. The method of claim 1 wherein wire-bonding further includes connecting a second bond wire coupling the optical sensor to the substrate, the second bond wire formed on an opposite side of the optical sensor from the first bond wire.

5. The method of claim 1 wherein mounting the optical sensor includes mounting the optical sensor to the substrate with an embedded chip having an embedded chip active side facing toward the optical sensor.

6. A method of manufacturing an optical sensor packaging system comprising:
   providing a substrate, the substrate including a substrate encapsulation and an embedded chip coupled to a redistribution pad, the substrate encapsulation encapsulating the embedded chip;
   depositing a photo sensitive material on an optical sensor;
   exposing portions of the photo sensitive material to light;

developing the photo sensitive material to remove the photo sensitive material not covering a photo sensitive area of an active optical side of the optical sensor;

mounting the optical sensor to the substrate;

wire-bonding the optical sensor to the substrate with a bond wire connected from a sensor pad on the active optical side to the redistribution pad;

encapsulating the optical sensor, the bond wire, and the photo sensitive material with an over-mold, the over-mold formed with a top surface co-planar to a surface of the photo sensitive material, the over-mold forming a vertically extended border around the photo sensitive material and around the photo sensitive area, the over-mold formed above the bond wire, and the over-mold formed covering portions of the active optical side;

stripping the photo sensitive material from the active optical side and from between the vertically extended border leaving the active optical side exposed from within a sensing window, the sensing window bordered by the vertically extended border; and dicing the over-mold and the substrate encapsulation.

7. The method of claim 6 wherein depositing the photo sensitive material includes depositing a positive photo sensitive material degraded by the light, or a negative photo sensitive material strengthened by the light.

8. The method of claim 6 wherein mounting the optical sensor includes mounting the optical sensor with a film-over-wire die attach adhesive coupling the optical sensor to the embedded chip with embedded chip bond wires extended through the film-over-wire die attach adhesive.

9. The method of claim 6 wherein mounting the optical sensor includes mounting the optical sensor to the substrate with an embedded chip active side facing away from the optical sensor.

10. The method of claim 6 wherein mounting the optical sensor to the substrate includes mounting the optical sensor to a die pad exposed from the substrate encapsulation of the substrate.

11. An optical sensor packaging system comprising:

a substrate, the substrate including a redistribution pad;

an optical sensor mounted to the substrate, the optical sensor including a photo sensitive area of an active optical side of the optical sensor;

a first bond wire wire-bonding the optical sensor to the substrate connected from the active optical side to the redistribution pad; and an over-mold encapsulating the optical sensor, and the first bond wire, the over-mold formed with a top surface co-planar to a surface of photo sensitive material, the over-mold forming a vertically extended border around the photo sensitive area, and the over-mold formed above the first bond wire, the active optical side exposed from within a sensing window, the sensing window bordered by the vertically extended border.

12. The system of claim 11 further comprising a second optical sensor mounted to the substrate, the second optical sensor wire-bonded to the substrate, and the second optical sensor encapsulated with the over-mold.

13. The system of claim 11 further comprising a die attach material affixing the optical sensor to the substrate.

14. The system of claim 11 further comprising a second bond wire coupling the optical sensor to the substrate, the second bond wire formed on an opposite side of the optical sensor from the first bond wire.

15. The system of claim 11 wherein the substrate includes an embedded chip having an embedded chip active side facing toward the optical sensor.

16. A system of claim 11 wherein:

the substrate includes a substrate encapsulation, the substrate encapsulation encapsulating an embedded chip;

the photo sensitive material is patterned so the photo sensitive material covers the photo sensitive area of the active optical side of the optical sensor; and the first bond wire is connected from a sensor pad on the active optical side to the redistribution pad.

17. The system of claim 16 wherein the photo sensitive material is a positive photo sensitive material degraded by light, or a negative photo sensitive material strengthened by the light.

18. The system of claim 16 further comprising a film-over-wire die attach adhesive coupling the optical sensor to the embedded chip with embedded chip bond wires extended through the film-over-wire die attach adhesive.

19. The system of claim 16 the substrate includes an embedded chip active side facing away from the optical sensor.

20. The system of claim 16 further comprising a die pad exposed from the substrate encapsulation of the substrate and the optical sensor mounted thereto.

21. The system of claim 11 further comprising a light source mounted to the substrate, the light source wire-bonded to the substrate, and the light source encapsulated with the over-mold.

22. The method of claim 1 further comprising:

mounting a light source to the substrate;

wire-bonding the light source to the substrate; and wherein encapsulating the optical sensor further includes encapsulating the light source with the over-mold.

\* \* \* \* \*